(12) United States Patent
Yokota et al.

(10) Patent No.: US 8,963,016 B2
(45) Date of Patent: Feb. 24, 2015

(54) PRINTED WIRING BOARD AND METHOD FOR MANUFACTURING SAME

(75) Inventors: Hideki Yokota, Takasaki (JP); Masashi Miyazaki, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 329 days.

(21) Appl. No.: 13/124,828

(22) PCT Filed: Oct. 30, 2009

(86) PCT No.: PCT/JP2009/069017
§ 371 (c)(1),
(2), (4) Date: Apr. 18, 2011

(87) PCT Pub. No.: WO2010/050627
PCT Pub. Date: May 6, 2010

(65) Prior Publication Data
US 2011/0203836 A1 Aug. 25, 2011

(30) Foreign Application Priority Data

Oct. 31, 2008 (JP) .................................. 2008-281443

(51) Int. Cl.
*H05K 1/16* (2006.01)
*H05K 1/03* (2006.01)
(Continued)

(52) U.S. Cl.
CPC ............... *H05K 1/183* (2013.01); *H01L 24/18* (2013.01); *H05K 3/4608* (2013.01);
(Continued)

(58) Field of Classification Search
CPC .. H01L 23/142; H05K 1/0281; H05K 1/0224; H05K 1/182; H05K 1/183; H05K 1/184; H05K 1/185; H05K 1/186; H05K 1/187; H05K 1/188

USPC ............... 174/260, 255; 29/835, 837, 855; 438/121; 361/761, 762, 763
See application file for complete search history.

(56) References Cited

U.S. PATENT DOCUMENTS 6,085,415 A 7/2000 Gandhi et al.
6,238,952 B1 * 5/2001 Lin ............................... 438/110
(Continued)

FOREIGN PATENT DOCUMENTS

CN 1669374 A 9/2005
EP 1592061 A2 * 11/2005 ............ H01L 23/538
(Continued)

OTHER PUBLICATIONS

EP1592061 A2 provided with Office Action.*
(Continued)

*Primary Examiner* — Chau N Nguyen
*Assistant Examiner* — Roshn Varghese
(74) *Attorney, Agent, or Firm* — Law Office of Katsuhiro Arai

(57) ABSTRACT

Disclosed is a printed wiring board offering improved reliability through increased mechanical strength at the bottom of cavity areas for mounting components. A printed wiring board 10 is characterized in that an insulation layer 16 is formed on either the top or bottom side of a metal core 11, while an opening 12 formed in the metal core 11 is used as a cavity area 15a for mounting a component, wherein a reinforcement pattern 30 is formed on the surface of an insulation layer facing the bottom of the cavity area 15a in the insulation layer 16. The reinforcement pattern 30 is made of the same material as the wiring patterns 28c, 29c formed on the insulation layer 16, and also formed simultaneously with these wiring patterns 28c, 29c.

14 Claims, 16 Drawing Sheets

(51) Int. Cl.
- *H05K 1/18* (2006.01)
- *H05K 3/34* (2006.01)
- *H01L 23/00* (2006.01)
- *H05K 3/46* (2006.01)
- *H05K 1/05* (2006.01)

(52) U.S. Cl.
CPC ......... *H05K 3/4697* (2013.01); *H01L 2224/18* (2013.01); *H01L 2924/01004* (2013.01); *H01L 2924/01013* (2013.01); *H01L 2924/01029* (2013.01); *H01L 2924/01033* (2013.01); *H01L 2924/01078* (2013.01); *H01L 2924/01079* (2013.01); *H01L 2924/01082* (2013.01); *H01L 2924/14* (2013.01); *H01L 2924/19041* (2013.01); *H01L 2924/3011* (2013.01); *H01L 2924/3025* (2013.01); *H05K 1/056* (2013.01); *H05K 1/185* (2013.01); *H05K 2201/09127* (2013.01); *H05K 2201/09781* (2013.01); *H01L 2924/01005* (2013.01); *H01L 2924/01006* (2013.01); *H01L 2924/014* (2013.01)
USPC .......... 174/260; 174/255; 361/761; 361/762; 29/837

(56) References Cited

U.S. PATENT DOCUMENTS

| | | | | |
|---|---|---|---|---|
| 6,291,775 | B1* | 9/2001 | Saitoh | 174/250 |
| 6,625,880 | B2* | 9/2003 | Nabemoto et al. | 29/830 |
| 6,855,577 | B2* | 2/2005 | Azuma | 438/118 |
| 7,807,511 | B2* | 10/2010 | Mangrum et al. | 174/521 |
| 8,436,250 | B2* | 5/2013 | Takahashi et al. | 174/255 |
| 2001/0018983 | A1* | 9/2001 | Sakai et al. | 174/255 |
| 2003/0226688 | A1* | 12/2003 | Jairazbhoy et al. | 174/255 |
| 2004/0183187 | A1* | 9/2004 | Yamasaki et al. | 438/617 |
| 2006/0175692 | A1* | 8/2006 | Hsu | 438/121 |
| 2006/0208356 | A1* | 9/2006 | Yamano et al. | 257/734 |
| 2006/0255440 | A1 | 11/2006 | Miyazaki et al. | |
| 2007/0074900 | A1 | 4/2007 | Lee et al. | |
| 2007/0187137 | A1 | 8/2007 | Isebo | |
| 2008/0006928 | A1 | 1/2008 | Miyazaki et al. | |
| 2008/0055863 | A1 | 3/2008 | Cho et al. | |
| 2009/0126982 | A1 | 5/2009 | Nakamura et al. | |
| 2010/0078205 | A1* | 4/2010 | Sakai et al. | 174/260 |

FOREIGN PATENT DOCUMENTS

| | | |
|---|---|---|
| JP | S63-255996 A | 10/1988 |
| JP | H05-90764 A | 4/1993 |
| JP | H07-154039 A | 6/1995 |
| JP | 2002-368349 A | 12/2002 |
| JP | 2003-347741 A | 12/2003 |
| JP | 2004-006576 A | 1/2004 |
| JP | 2004-200201 A | 7/2004 |
| JP | 2007-103939 A | 4/2007 |
| JP | 2009-123874 A | 6/2009 |
| WO | 00/07267 A1 | 2/2000 |
| WO | 2006/120826 A | 11/2006 |

OTHER PUBLICATIONS

Notification of First Office Action issued by Chinese Patent Office, mailed Dec. 3, 2012, for Chinese counterpart application No. 200980143642.4.

Notification of Reasons for Refusal dated Mar. 20, 2012, issued by the Korean Intellectual Property Office (KIPO) for the Korean counterpart application, 10-2011-7009219.

The Extended European Search Report (EESR) issued by the European Patent Office, mailed Jun. 19, 2012, for European counterpart Application No. 09823730.8.

Notification of Reasons for Refusal issued by the Japanese Patent Office, mailed Aug. 21, 2012, for Japanese counterpart application No. 2010-535861.

Notification of Reasons for Refusal issued by the Japanese Patent Office, mailed Feb. 22, 2013, for Japanese counterpart application No. 2010-535861.

Notification of Second Office Action issued by the Chinese Patent Office, mailed Jun. 24, 2013, for Chinese counterpart application No. 200980143642.4.

Notification of Third Office Action issued by the Chinese Patent Office, mailed Jan. 13, 2014, for Chinese counterpart application No. 200980143642.4.

Notification of Reasons for Refusal issued by the Japanese Patent Office, mailed Dec. 20, 2013, for Japanese counterpart application No. 2013-085440.

A Notification of Examination Opinions with Search Report issued by Taiwan Intellectual Property Office, mailed Mar. 28, 2014, for Taiwan counterpart application No. 098137017.

\* cited by examiner (a)

(b)

(a)

(b)

PRINTED WIRING BOARD AND METHOD FOR MANUFACTURING SAME

This application is the U.S. National Phase under 35 U.S.C. §371 of International Application PCT/JP2009/069017, filed Oct. 30, 2009, which claims priority to Japanese Patent Application No. 2008-281443, filed Oct. 31, 2008. The International Application was published under PCT Article 21(2) in a language other than English.

TECHNICAL FIELD

The present invention relates to a wiring board, and more specifically to a printed wiring board having cavity storage areas for mounting electronic components, as well as a method for manufacturing the same.

BACKGROUND ART

Demand for thinner electronic devices is growing in recent years, and there is a need for making internal components, especially printed wiring boards on which electronic components are mounted, even thinner. Since the thickness of a printed wiring board on which electronic components are mounted (hereinafter referred to as "A" for the sake of convenience) is given as a sum of the thickness of the printed wiring board itself (hereinafter referred to as "B" for the sake of convenience) and height of the components (hereinafter referred to as "C" for the sake of convenience) (A=B+C), the aforementioned need can be met by reducing B or C or both. However, how much B (thickness of printed wiring board) and C (height of components) can be reduced is limited, and the industry has been waiting for breakthrough measures.

With regard to this point, Patent Literature 1 (hereinafter referred to as the "background art") listed below describes a technology to form cavity areas on a printed wiring board and mount components in these cavity areas. If the depth of the cavity area is D, for example, this background art provides the same effect as reducing the height of components C by D, and effectively reduces, to a substantial degree, the thickness of component-mounted printed wiring board A.

With a printed wiring board conforming to the aforementioned background art, however, the "bottom" of cavity areas for mounting electronic components is not very strong and, when electronic components are mounted in the cavity areas, these cavity areas for mounting components will crack due to the pressure applied to the component surface if a strong, flat jig is not placed below the insulation layer forming the bottom, or if the height of components C exceeds the depth of cavity area D. In the worst case scenario, the bottom may come off. This problem can also occur when the height of components C is less than the depth of cavity area D.

FIG. 18 shows the structure of the background art. In this figure, a printed wiring board 1 is constituted by a metal sheet 2 having, on one side of it, a resin film 3 and insulation sheet 4 attached on top of each other, as well as an electronic component 6 mounted in a cavity area 5 formed on this metal sheet 2. Here, A is the thickness of the printed wiring board 1 on which the component is mounted, B is the thickness of the printed wiring board 1 itself, C is the height of the component 6, and D is the depth of the cavity area 5. Here, the magnitude correlation "C>D" holds true, meaning that a part of the component 6 is projecting from the cavity area 5.

In this condition, with the electronic component mounted, an unwanted pressure P may be applied to the surface of the component 6 when the printed wiring board 1 is assembled into an electronic device. A similar pressure P may also be applied, even after the printed wiring board 1 has been assembled, to the surface of the component 6 via an enclosure of the electronic device.

The mechanical strength of the printed wiring board 1 is primarily assured by the metal sheet 2, but the strength of the location where this metal sheet 2 is missing, or specifically a bottom 5a of the cavity area 5, depends on the strength of the resin film 3 and insulation sheet 4 that are much more fragile than the metal sheet 2, and consequently the bottom 5a of this cavity area 5 may detach depending on the degree of the aforementioned pressure P.

As for printed wiring boards having cavity areas for mounting components, there is a need in the market, of late, for ultra-thin boards that were not before required, such as boards of 1 mm or less in thickness. With these ultra-thin printed wiring boards, the aforementioned problem of mechanical fragility becomes more serious. If the insulation layer at the bottom of the cavity area is only several tenths of a millimeter thick, the bottom may crack or detach even with a very small force.

When printed wiring boards having cavity areas for mounting components began being available on the market, these boards were much thicker than 1 mm. Accordingly, forming the cavity area by machining the board, for example, was fairly easy. On the other hand, to form a cavity area on an ultra-thin printed board whose thickness is only 1 mm or even less, first and foremost it is necessary to overcome the aforementioned problem (mechanical fragility at the bottom of the cavity area), because unless this problem is overcome, the above market need of late cannot be met.

For example, current technology is sufficient to form a cavity area of 0.4 mm in depth on a board of 0.5 mm in thickness. A module can be made thinner by the depth of this cavity area. This thickness reduction of only 0.4 mm or so is enough to meet the market need of late. Rather, a primary reason why this market need cannot be met is the aforementioned mechanical fragility at the bottom of the concaved area.

Patent Literature 1 Japanese Patent Laid-open No. Sho 55-145390

SUMMARY OF THE INVENTION

Problems to be Solved by the Invention

In light of the above, the object of the present invention is to provide a printed wiring board offering improved reliability through increased mechanical strength at the bottom of cavity areas for mounting components, as well as a method for manufacturing such printed wiring board.

Means for Solving the Problems

To achieve the aforementioned object, the invention from a first aspect is a printed wiring board with a cavity area for mounting an electronic component, where the cavity area is formed by providing, in a sheet-shaped metal core, a through-opening connecting its two principle sides in a location where an electronic component is to be stored, and then forming an insulation layer on one principle side of the metal core to cover one end of the opening; wherein, on one side of the insulation layer not contacting the metal core, wiring patterns for connecting electrodes of the electronic component are provided, and a reinforcement pattern not contacting the wiring patterns is formed in an approximate area corresponding to the cavity.

The invention from a second aspect is a printed wiring board according to the invention from the first aspect, wherein the reinforcement pattern is made of the same material as the wiring patterns formed on the same side, and also formed simultaneously with these wiring patterns.

The invention from a third aspect is a printed wiring board according to the invention from the first aspect, wherein the reinforcement pattern is formed wider than the area of the opening.

The invention from a fourth aspect is a printed wiring board according to the invention from the first aspect, wherein the reinforcement pattern is a rectangle in a plan view.

The invention from a fifth aspect is a printed wiring board according to the invention from the fourth aspect, wherein the reinforcement pattern has many small holes.

The invention from a sixth aspect is a printed wiring board according to the invention from the first aspect, wherein the reinforcement pattern is divided in a plan view.

The invention from a seventh aspect is a method for manufacturing printed wiring board comprising:
a step to make a ring-shaped opening in a sheet-shaped metal core, which opening is interrupted at a bridge part, to form an island-like shape;
a step to form, on one principle side of the metal core, a wiring layer having an insulation layer and wiring patterns;
a step to form, on the other principle side of the metal core, a wiring layer having an insulation layer, wiring patterns and a reinforcement pattern;
a step to open an area corresponding to the island-like shape in one of the wiring layers; and
a step to remove the island-like shape by utilizing this opening.

The invention from a eighth aspect is a method for manufacturing printed wiring board according to the invention from the seventh aspect, further comprising a step to fill with an insulator the opening around the island-like shape when the insulation layer in the wiring layer is formed.

The invention from a ninth aspect is a method for manufacturing printed wiring board according to the invention from the seventh aspect, wherein the reinforcement pattern is made of the same material as the wiring patterns formed on the same side, and also formed simultaneously with these wiring patterns.

The invention from a tenth aspect is a method for manufacturing printed wiring board according to the invention from the seventh aspect, wherein the reinforcement pattern is formed wider than the area of the opening corresponding to the island-like shape.

The invention from an eleventh aspect is a method for manufacturing printed wiring board comprising:
a step to form, on one principle side of a sheet-shaped metal core, a wiring layer having an insulation layer and wiring patterns formed on this insulation layer;
a step to form, on the other principle side of the metal core, a wiring layer having an insulation layer, wiring pattern formed on this insulation layer, and a reinforcement pattern;
a step to open an area where an electronic component is to be stored, in the wiring layer formed on the one principle side; and
a step to utilize this opening to form in the metal core an opening roughly as wide as the aforementioned opening.

The invention from a twelfth aspect is a method for manufacturing printed wiring board according to the invention from the eleventh aspect, wherein the step to form an opening in the metal core uses etching to form the opening.

The invention from a thirteenth aspect is a method for manufacturing printed wiring board according to the invention from the eleventh aspect, wherein the reinforcement pattern is made of the same material as the wiring patterns formed on the same side, and also formed simultaneously with these wiring patterns.

The invention from a fourteenth aspect is a method for manufacturing printed wiring board according to the invention from the eleventh aspect, wherein the reinforcement pattern is formed wider than the area of the opening corresponding to the island-like shape.

Effects of the Invention

According to the present invention, a printed wiring board offering improved reliability through increased mechanical strength at the bottom of cavity areas for mounting components, as well as a method for manufacturing such printed wiring board, can be provided.

The aforementioned object and other objects, constitutions/characteristics and operations/effects of the present invention are revealed in greater detail by the explanation below and attached drawings.

MODE FOR CARRYING OUT THE INVENTION

First Embodiment

Figure 1:
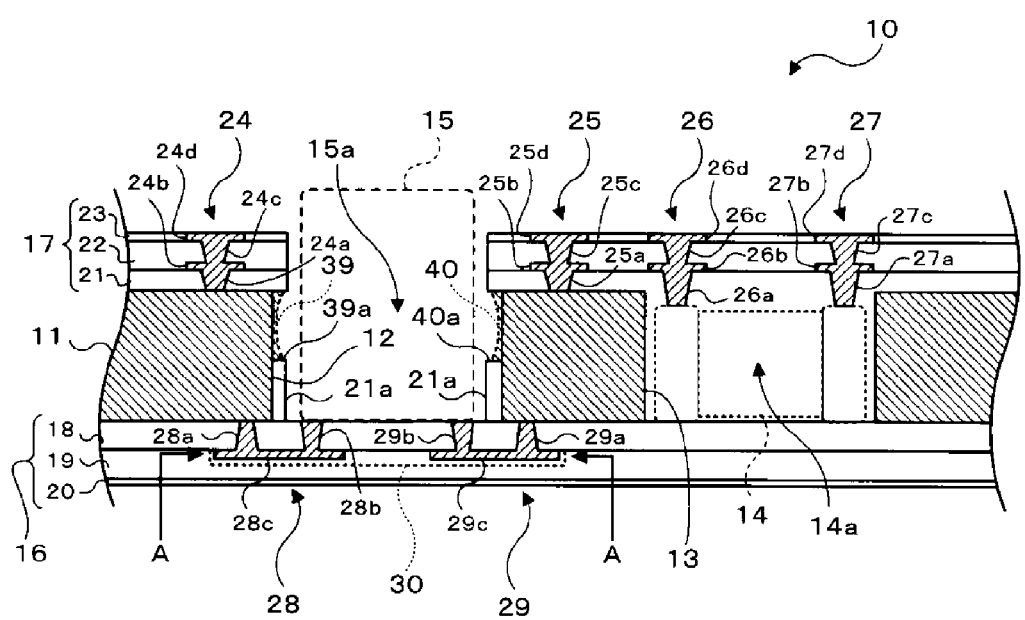
FIG. 1 is a section view of the printed wiring board in the first embodiment, cut along a line crossing the centers of cavity areas for storing electronic components.

Embodiments of the present invention are explained below by referring to the drawings.

First, the structure is explained.

FIG. 1 is a section view of a printed wiring board in an embodiment, cut along a line crossing the centers of the cavity areas for storing representative electronic components. In this figure, a printed wiring board 10 has a sheet-shaped metal core 11 made of conductive, rigid metal or typically copper, and multi-layer wiring layers respectively formed on the top and bottom sides (both principle sides) of this metal core 11. Note that the term "top and bottom" refers to the vertical direction of the figure as viewed from the front side of the figure. The multi-layer wiring layer positioned on the bottom side of the metal core 11 is hereinafter referred to as the bottom layer 16, while the multi-layer wiring layer positioned on the top side is referred to as the top layer 17.

The metal core 11 has, at a key location or locations, one or more through-openings connecting the top and bottom sides of the metal core 11 for the purpose of installing electronic components, or in other words, a rectangular through-opening or openings connecting the front and back sides of the metal core 11. In the example shown in this figure, two openings are formed, or specifically an opening 12 positioned on the left side of the figure and an opening 13 positioned on the right side. The right opening 13 is used as a cavity area 14a for storing a short electronic component 14 whose height is equal to or less than the thickness of the metal core 11, while the left opening 12 is used as a cavity area 15a for storing a tall electronic component 15 whose height is far greater than the thickness of the metal core 11. Note that the inner side face of the left opening 12 is covered with an insulator 21a having a specified thickness (the same as a first insulation layer 21 explained later), and therefore the practical opening part of this opening 12, or specifically the part practically used as the cavity area 15a, excludes the thickness of this insulator.

Examples of these short electronic component 14 and tall electronic component 15 include capacitors, resistors, integrated circuits and transistors, among others, and an inductor is a representative example of the tall electronic component 15. An inductor is formed by storing a bobbin, around which coil has been wound, in a vertically long, cubic case. Because of this structure, size reduction is more difficult with inductors than capacitors, resistors, and other electronic components, and consequently inductors tend to be taller.

Holes 39a, 40a are open at two locations, one each on the left and right, of the insulator 21a formed on the inner side face of the cavity area 15a. These holes 39a, 40a have bridges 39, 40 (both bridges 39, 40 have been etched) left on the walls.

In this embodiment, the bottom layer 16 has a layered structure constituted by a first insulation layer 18, a second insulation layer 19 and a gold plating 20 in order from the metal core 11, and similarly the top layer 17 has a layered structure constituted by a first insulation layer 21, a second insulation layer 22, and a gold plating 23 in order from the metal core 11. In the example shown in the figure, the bottom layer 16 and top layer 17 both have a two-insulation-layer structure, but they are not at all limited to such structure. They can have a multi-layer structure having more than two layers.

The top layer 17 further has conductive parts 24a, 25a, 26a, 27a formed at connection locations for constituting an electronic circuit on the surface of the first insulation layer 21 (these connection locations and other terms indicating the same are hereinafter simply referred to as "key locations"), wiring patterns 24b, 25b, 26b, 27b formed on the surface of the first insulation layer 21, conductive parts 24c, 25c, 26c, 27c formed at key locations on the surface of the second insulation layer 22, and wiring patterns 24d, 25d, 26d, 27d formed at key locations on the surface of the second insulation layer 22, and the foregoing are inter-connected electrically to constitute a first electrode 24 through fourth electrode 27.

On the other hand, the bottom layer 16 further has conductive parts 28a, 28b, 29a, 29b formed at key locations on the first insulation layer 18, and wiring patterns 28c, 29c formed at key locations on the second insulation layer 19, and the foregoing are connected electrically to constitute a fifth electrode 28 and sixth electrode 29. Here, the second insulation layer 19 of the bottom layer 16 not only has the aforementioned wiring patterns 28c, 29c, but also a reinforcement pattern 30 made of the same material as these wiring patterns 28c, 29c.

Figure 2:
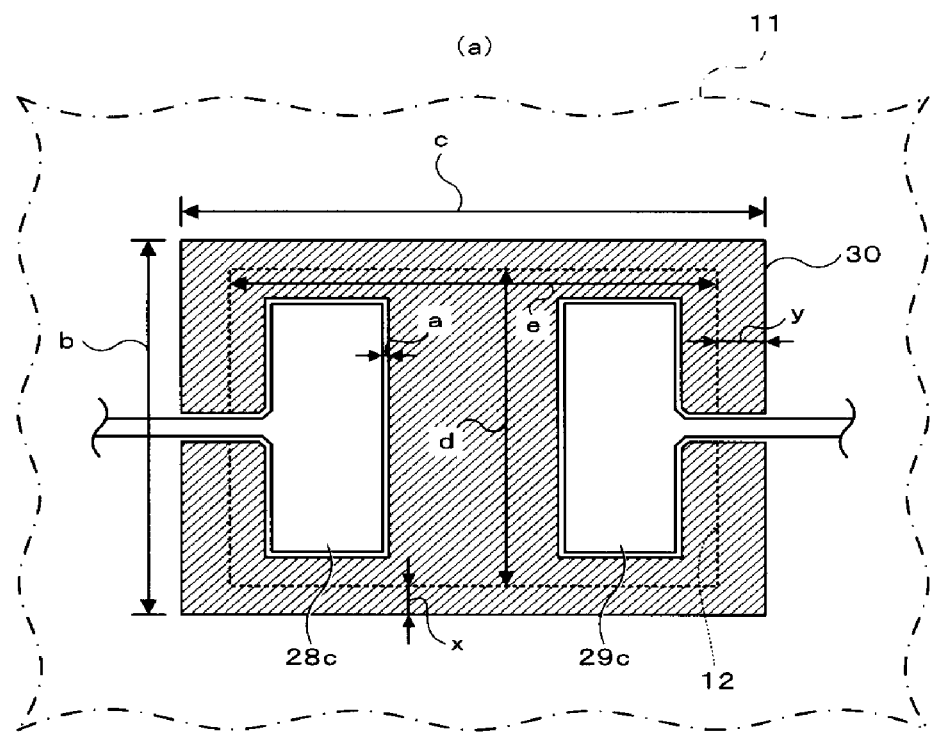
FIG. 2 is a plan view of the reinforcement pattern 30 corresponding to the plan over the area of view A-A in FIG. 1 as viewed from the bottom side.
Figure 2:
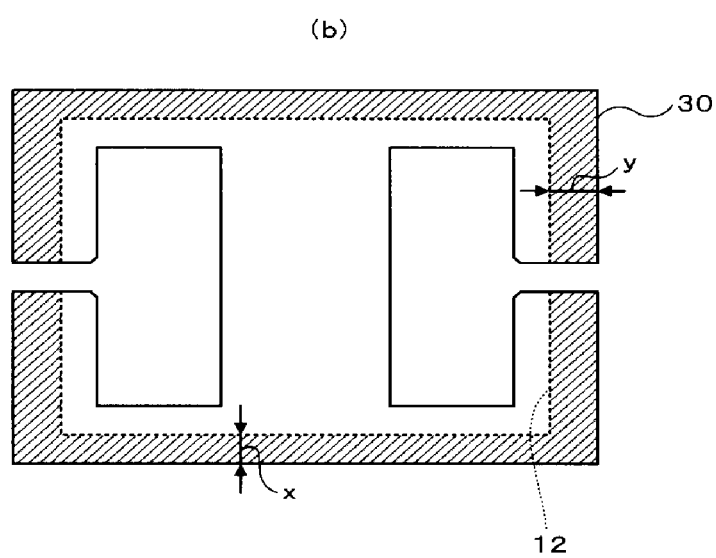
Figure 3:
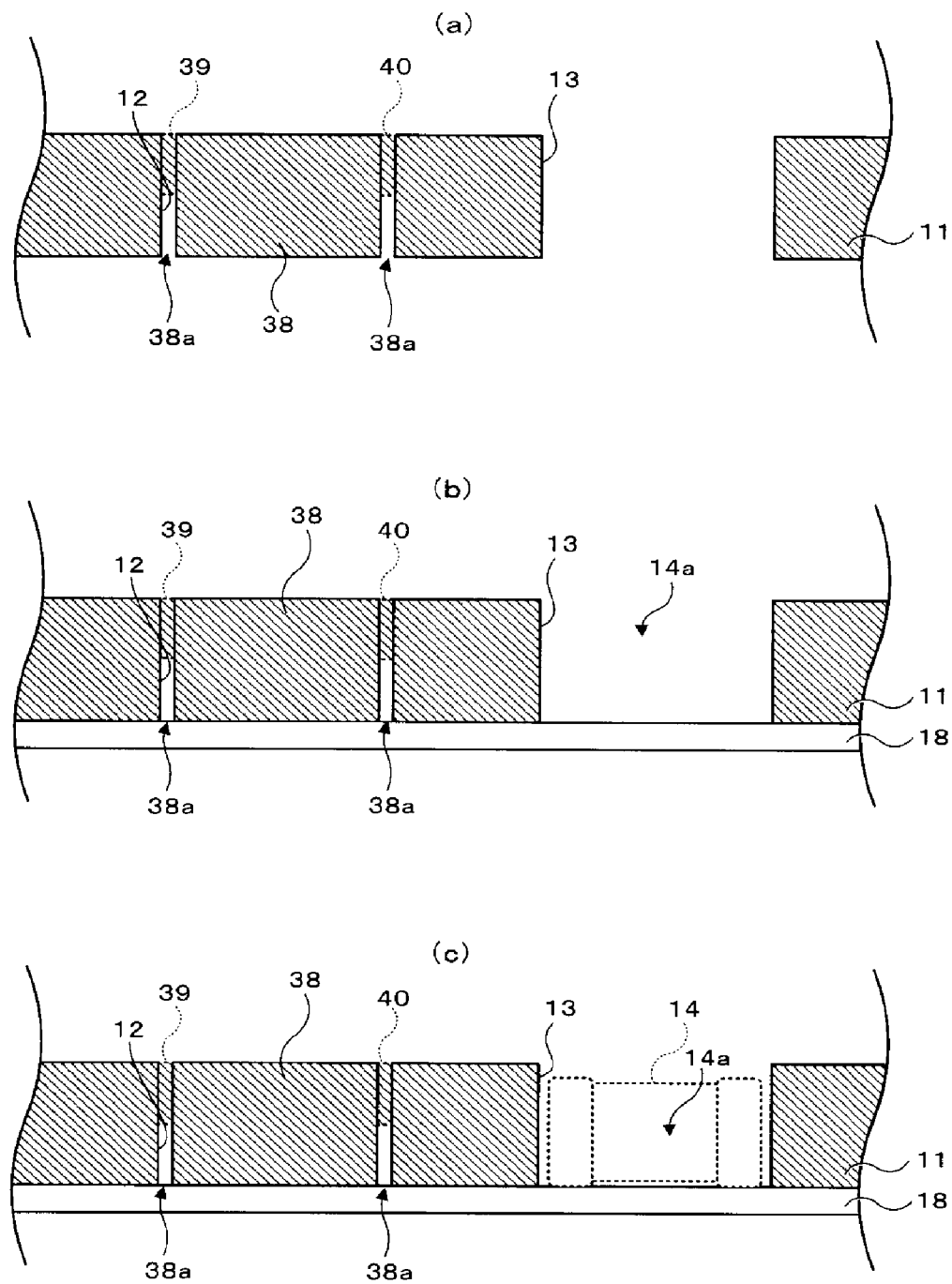
FIG. 3 illustrates a manufacturing process diagram for the printed wiring board in the first embodiment (first to third steps).
Figure 4:
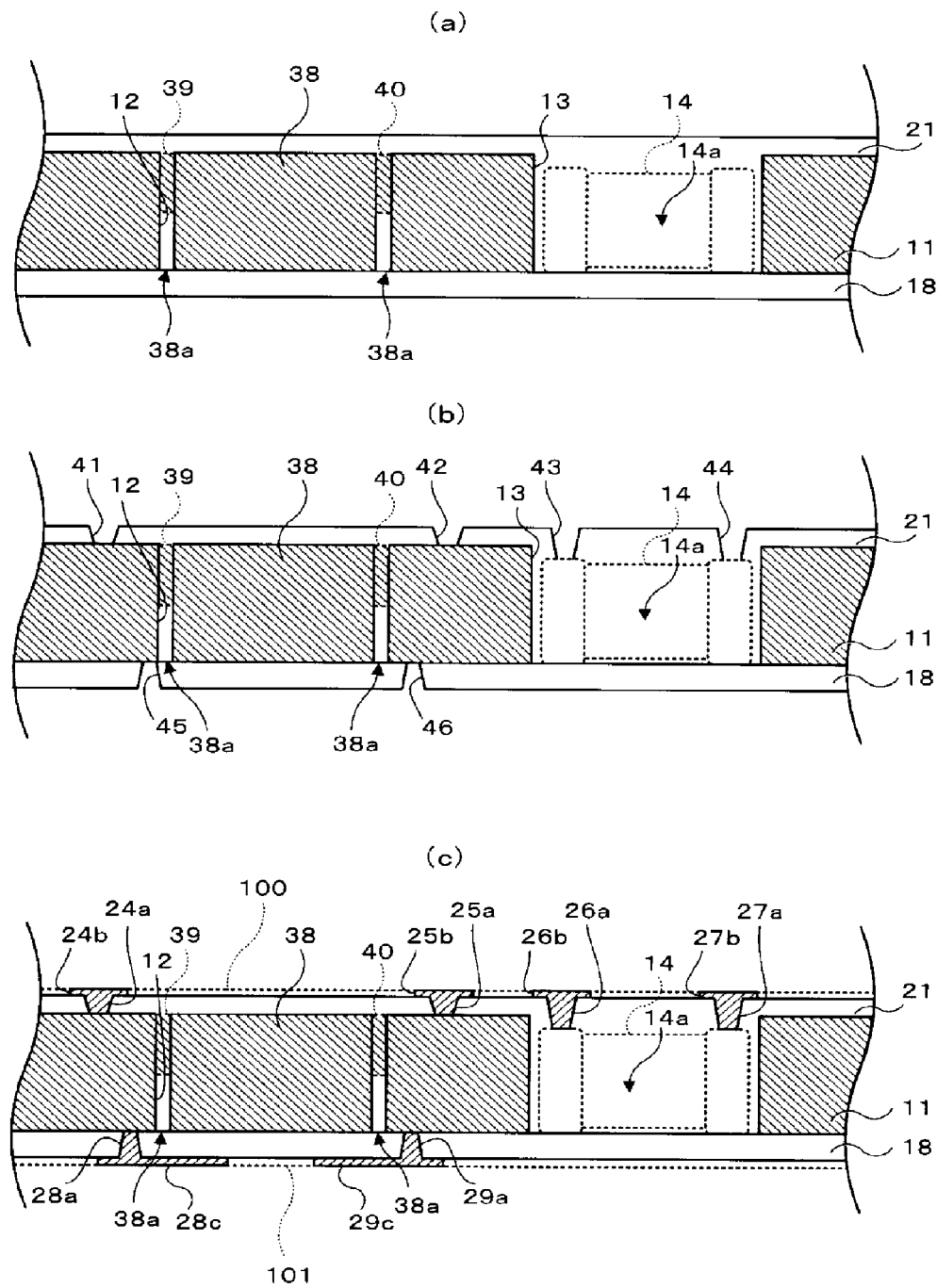
FIG. 4 illustrates a manufacturing process diagram for the printed wiring board in the first embodiment (fourth to sixth steps).
Figure 5:
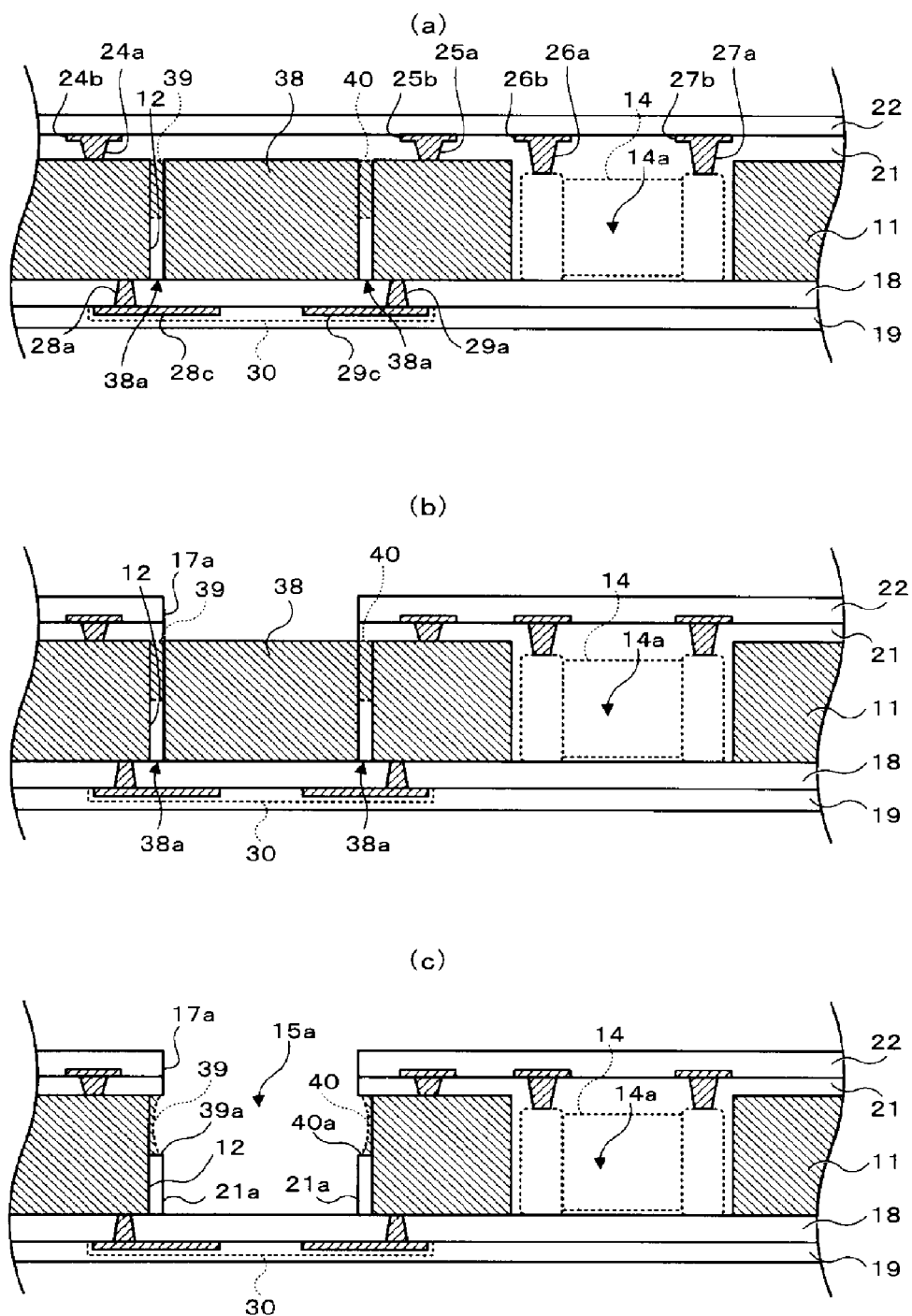
FIG. 5 illustrates a manufacturing process diagram for the printed wiring board in the first embodiment (seventh to ninth steps).
Figure 6:
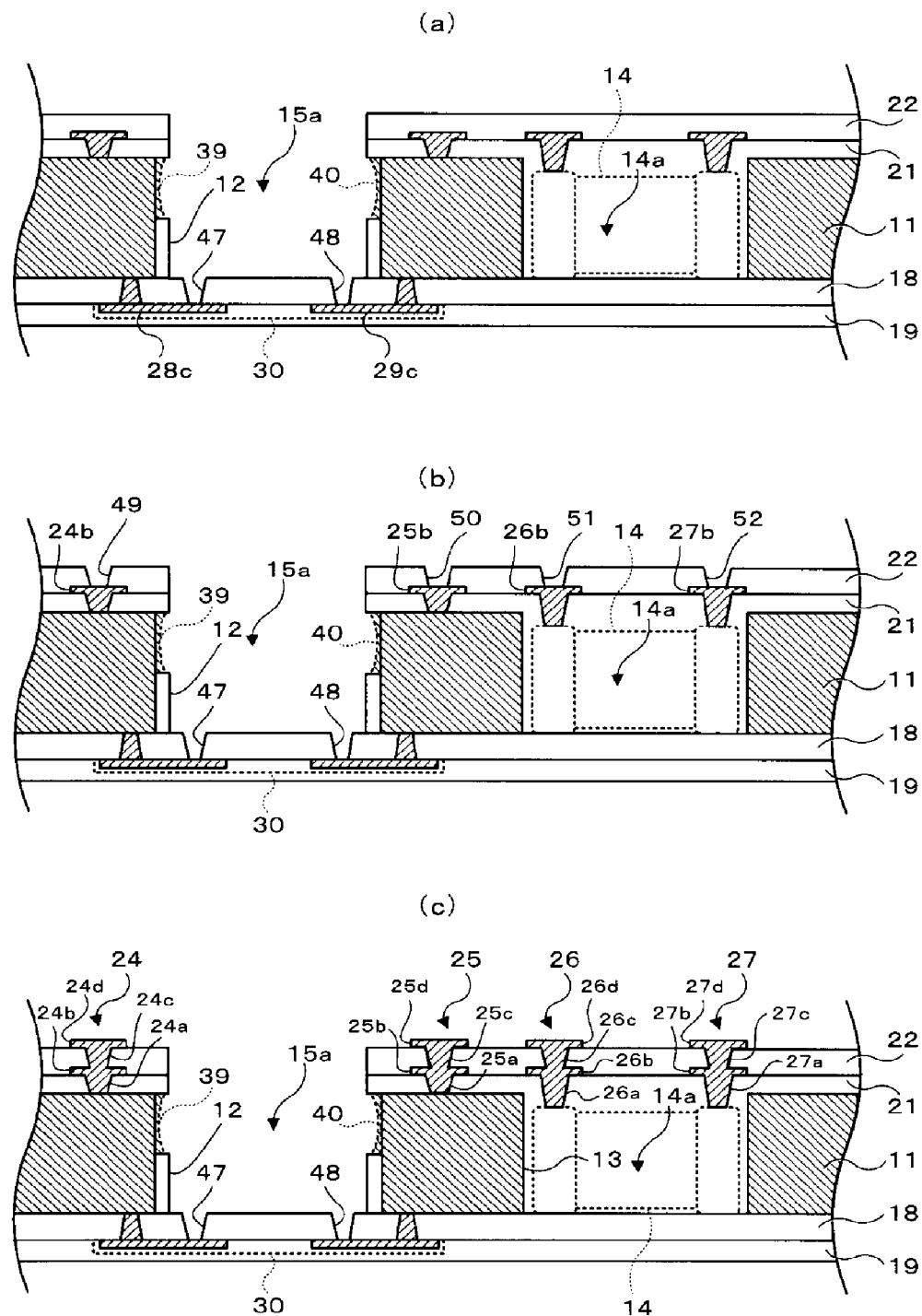
FIG. 6 illustrates a manufacturing process diagram for the printed wiring board in the first embodiment (tenth to twelfth steps).
Figure 7:
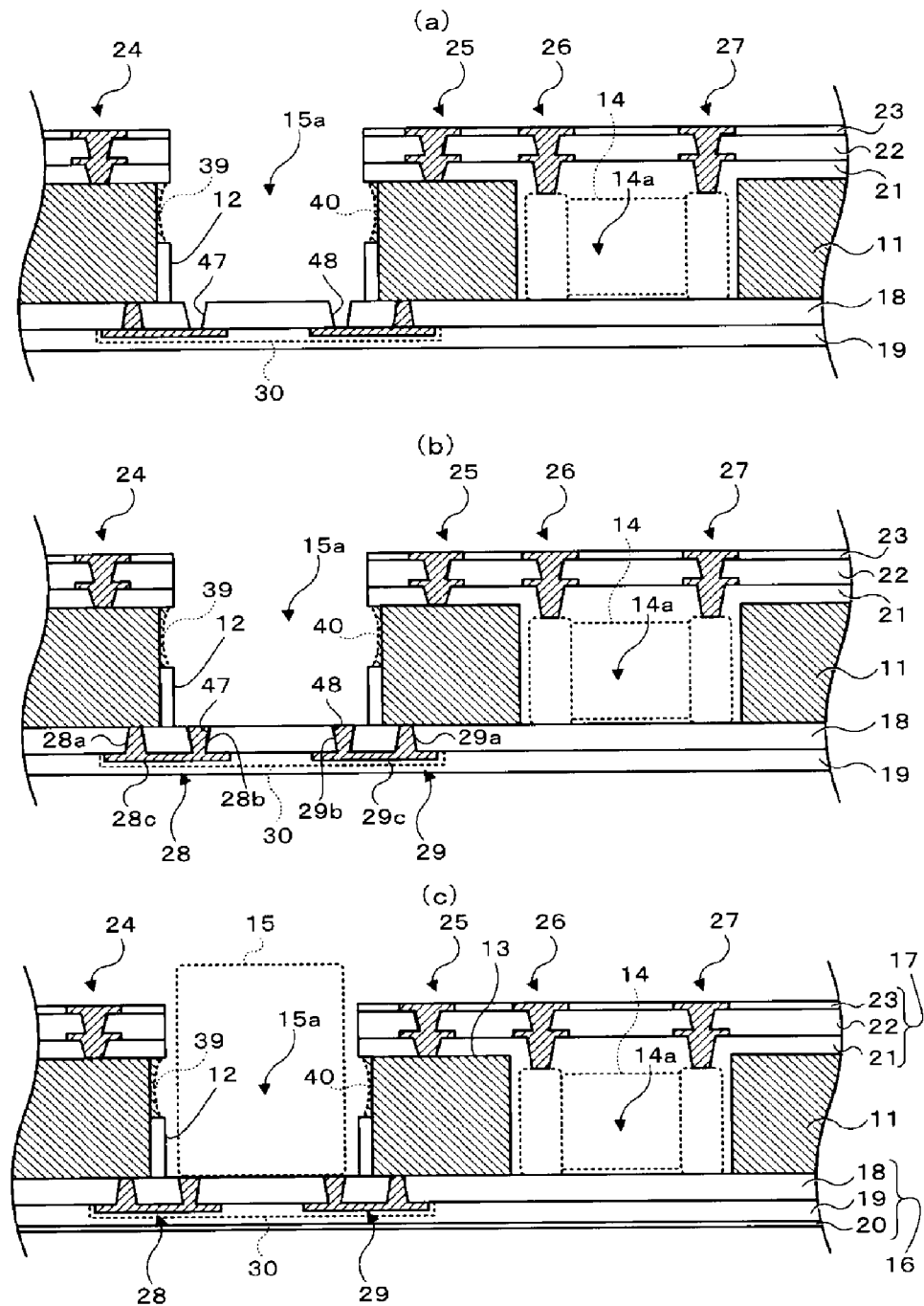
FIG. 7 illustrates a manufacturing process diagram for the printed wiring board in the first embodiment (thirteenth to fifteenth steps).

FIG. 2 is a plan view of the reinforcement pattern 30 corresponding to the plan over the area of view A-A in FIG. 1 as viewed from the bottom side. In (a), the hatched reinforcement pattern 30 is on the same side as the wiring patterns 28c, 29c formed at the locations on the first insulation layer 18, and it also surrounds these wiring patterns 28c, 29c while also separating and electrically insulating itself from these wiring patterns 28c, 29c. In the figure, a small gap a is provided.

The reinforcement pattern 30 has a rectangular outer shape (horizontally long rectangle in the example shown in the figure), and its vertical dimension b and horizontal dimension c are set larger than the vertical dimension d and horizontal dimension e of the opening 12 formed in the metal core 11. In other words, the magnitude correlations "b>d" and "c>e" hold true.

Now, in the figure, the difference between b and d on one side is given by x and the difference between c and e on one side is given by y. X and y indicate distances between the broken line representing the edge of the opening 12 and outline of the reinforcement pattern 30, or specifically the area where the reinforcement pattern 30 and metal core 11 overlap each other. In other words, the border areas of x and y in width are facing the metal core 11 in the periphery of the hatched reinforcement pattern 30 shown in (b).

Next, the manufacturing process is explained.

FIGS. 3 to 7 are section views showing the manufacturing process of the printed wiring board in the embodiment. In these sections, the section of the opening 12 corresponds to the crank-shaped section passing the centers of bridges 39, 40 in FIG. 8.

(1) First Step—FIG. 3(a)

Figure 8:
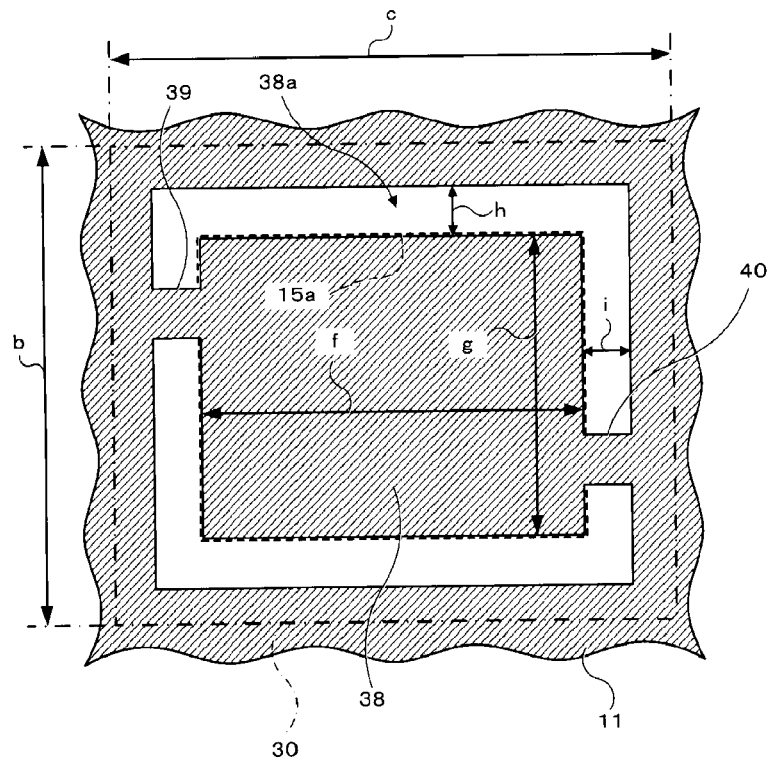
FIG. 8 is a partial plan view showing the island-like shape 38 in the metal core of the printed wiring board in the first embodiment.

First, locations where electronic components are to be stored are removed from the metal core 11 to form openings 12, 13. Note that with the opening 12 on the left side of the figure, the inner side of the opening 12 is not completely removed, but an island-like shape 38 connecting to the metal core 11 via bridges 39, 40 is left, as shown in FIG. 8. A trench-shaped opening 38a is provided between the island-like shape 38 and metal core 11 around it, and the bridges 39, 40 are passed over this opening 38a.

The following is a brief explanation of how to form the island-like shape 38 and bridges 39, 40. First, form the top side shown in FIG. 3(a) by, for example, printing an etching mask or attaching a film over the entire surface, except for the part where a trench-shaped opening 38a is to be formed, followed by exposure and development. Next, for the bottom side shown in FIG. 3(a), form an etching mask over the entire surface except for the parts where the trench-shaped opening 38a and bridges 39, 40 are to be formed. When etching is done this way, the trench-shaped opening 38a is formed as a through-hole, while at the same time the bridges 39, 40 are left only on the top side because on the bottom side the holes are formed as a result of etching, and consequently an island-like shape 38 connected via the bridges 39, 40 to the area around the opening 38a is formed, as shown in the section view in FIG. 3(a).

One role of the aforementioned opening 38a is to allow an insulation material to be filled in the opening 38a when the insulation layer 21 is press-formed on the top layer 16, so that an insulation wall will be formed when an electronic component is stored in a subsequent step. Another role is to make it easier to remove the island-like shape 38 in a subsequent step.

The function of the bridges 39, 40 is to maintain the mechanical strength needed to securely link the island-like shape 38 to the metal core 11, but this linking function is only temporary. This is because once the island-like shape 38 is removed in a subsequent step (refer to FIG. 5(c)), these bridges 39, 40 are no longer necessary. A desired embodiment where these bridges 39, 40 can display their intended function is explained below (quantity, size, thickness, and position in vertical direction).

First regarding the "quantity," desirably there should be many (at least three) bridges so that the island-like shape 38 can be securely linked to the metal core 11 and required strength maintained. If there are many bridges, however, many holes, such as etched bridge holes (refer to holes 39a, 40a in FIG. 1) will remain in the inner wall of the cavity area 15a once the island-like shape 38 is removed, which is not desirable. If there are not enough bridges (typically this means there is only one bridge), on the other hand, the island-like shape 38 is linked to the metal core 11 in a cantilever configuration and sufficient mechanical strength cannot be achieved. This means that the aforementioned function may not be achieved, which is undesirable. Still, such quantity (one bridge) may be adopted as long as it is confirmed, through sufficient verification, that the aforementioned function can be achieved. For example, sometimes even one bridge can achieve the aforementioned function if the bridge is wide. Accordingly, in practical settings the number should be more than one, but less than three, or specifically two, and the number of bridges 39, 40 in the embodiment (two bridges) was determined based on this concept. In other words, this number (two bridges) only represents the quantity adopted by the best embodiment (best mode). In principle, any number can be used as long as the specified mechanical strength can be achieved.

Next, the "size (length, width)" of bridges 39, 40 is explained. The smaller the bridges are, the better, because the bridges will be removed in a subsequent step. Also, any desired "width" can be set for bridges 39, 40. For example, they can have a width of 0.3 mm or 0.2 mm, or 0.1 mm. Note that any width smaller than 0.1 mm makes it difficult to create bridges by etching, so applying such small width at mass-production level would be difficult.

Next, the "thickness" of bridges 39, 40 is explained. An appropriate thickness of bridges 39, 40 is determined in relation to the thickness of the metal core 11. If the bridges 39, 40 have the same thickness as the metal core 11, for example, the aforementioned "holes" (etched bridge holes; refer to holes 39a, 40a in FIG. 1) become larger accordingly, and large areas of etched bridge 39, 40 surfaces are exposed, which is not appropriate. Accordingly, it is desirable to keep the bridges 39, 40 less thick than the metal core 11. Although the specific value varies depending on the thickness of the metal core 11, if the metal core 11 is approx. 1 mm thick, for example, then the bridges 39, 40 can have a thickness of approx. 0.5 mm, roughly one half the core thickness. Note, however, that this value (0.5 mm) is only a reference. Any thickness can be used as long as it has been reduced as much as possible and also permits forming and removal in the manufacturing process.

Next, the "position (position in a section view)" of bridges 39, 40 is explained. If the bridges 39, 40 are not as thick as the metal core 11, the bridges 39, 40 can be positioned (a) farthest from the bottom of the cavity 15a, (b) closest to the bottom of the cavity 15a, or (c) between these two positions. Any of these potions can be selected. Here, (a) was selected in the embodiment.

The island-like shape 38 is explained.

FIG. 8 is a plan view showing the island-likes shape 38. As illustrated, the island-like shape 38 is linked to the metal core 11 via the bridges 39, 40 formed on the opposing sides at the left and right of the figure, and the horizontal dimension f and vertical dimension g of this island-like shape 38 are roughly the same as the horizontal dimension and vertical dimension of the opening of the cavity area 15a for storing the tall electronic component 15. Also, a trench-shaped opening 38a is provided around the island-like shape 38, and the bridges 39, 40 are formed in a manner dividing this opening 38a into two. Here, if the vertical width of the opening 38a in the figure is given by h and lateral width of the opening 38a is given by i, the relationships "f+2i<c" and "g+2h<b" hold true. Here, c and b are the vertical and horizontal dimensions of the reinforcement pattern 30 (c is the horizontal dimension, while b is the vertical dimension). As long as these relationships (f+2i<c, g+2h<b) are met, the relationships of the reinforcement pattern 30 and opening 12 in FIG. 2, or "b>d" and "c>e," are met and an overlap for adjusting strength (hatched part in FIG. 2(b)) can be provided between the reinforcement pattern 30 and metal core 11.

As a method for removing the bridges 39, 40 from the metal core when the openings 12, 13 are formed, metal etching, cutting, etc. can be used, and any other methods can also be adopted.

(2) Second Step—FIG. 3(b)

Next, the first insulation layer 18 is formed on the bottom side of the metal core 11 and the openings 12, 13 are closed on one side with the insulation layer (bottom layer) to form their bottoms, and consequently the opening 13 is used as the cavity area 14a for storing the short electronic component 14. The material for the first insulation layer 18 is not specifically defined. In essence, as long as it has electrical insulation property, any material such as resin, ceramics or other material used alone, or glass fiber or nonwoven fabric impregnated with resin can be used. Also the bottom side of the metal core 11 may be chemically or physically treated to improve the adhesion between the first insulation layer 18 and metal core 11.

(3) Third Step—FIG. 3(c)

Next, the short electronic component 14 is mounted in the cavity area 14a.

(4) Fourth Step—FIG. 4(a)

Next, the first insulation layer 21 is press-formed on the top side of the metal core 11. The specific material for this first insulation layer 21 should be any material that has electrical insulation property and can completely fill any gaps around the openings 12, 13 in the metal core 11. For example, the first insulation layer 21 may use such materials as resin and ceramics. In this step, any chemical or physical treatment can be added to the insulation material with the intent of improving the adhesion with the metal core 11.

(5) Fifth Step—FIG. 4(b)

Next, holes 41 to 46 are opened in the locations where conductive members used for electrical circuit connections are to be formed, by means of laser cutting or drilling, for example, in the first insulation layers 18, 21 on the top and bottom sides of the metal core 11.

(6) Sixth Step—FIG. 4(c)

Next, these holes 41 to 46 are metal-plated on the inside (or on inner walls) or filled with conductive paste to make them conductive parts 24a, 25a, 26a, 27a, 28a, 29a, and then metal films 100, 101 made of copper, etc., are formed on these conductive parts 24a, 25a, 26a, 27a, 28a, 29a, after which these metal films 100, 101 are patterned to form wiring patterns 24b, 25b, 26b, 27b, 28c, 29c.

Here, these conductive parts 24a, 25a, 26a, 27a, 28a, 29a and wiring patterns 24b, 25b, 26b, 27b, 28c, 29c, together with the conductive parts 24c, 25c, 26c, 27c and wiring patterns 24d, 25d, 26d, 27d formed in subsequent steps (such as the twelfth and fourteenth steps), constitute the first electrode 24 through fourth electrode 27 positioned on the top side of the metal core 11 as well as fifth electrode 28 and sixth electrode 29 positioned on the bottom side of the metal core 11.

This embodiment is characterized in that in this sixth step, a reinforcement pattern 30 is formed on the bottom side of the metal core 11 at the same time when the metal films 100, 101 are patterned to form wiring patterns 24b, 25b, 26b, 27b, 28c, 29c. In other words, while traditionally (according to the background art) only wiring patterns 28c, 29c are formed on the bottom side of the metal core 11, this embodiment is characterized, structurally, in that the wiring patterns 28c, 29c and reinforcement pattern 30 are formed simultaneously from the metal film 101.

This enhances the mechanical strength at the bottom of the cavity areas 14a, 15a for storing components as formed on the metal core 11, to avoid worst-case scenarios such as the bottoms detaching. In this stage, however, only the cavity area 14a is formed and the cavity area 15a is not yet formed. The cavity area 15a is formed in the ninth step (step shown in FIG. 5(c)) explained later.

(7) Seventh Step—FIG. 5(a)

Next, the second insulation layers 19, 22 are formed on the top and bottom sides of the metal core 11. The specific material for these second insulation layers 19, 22 may be resin, ceramics or other material used alone, or resin, ceramics or other material mixed with glass fiber or nonwoven fabric and then formed, for example. If necessary, any chemical or physical treatment can be added with the intent of improving the adhesion with the first insulation layers 18, 21.

If the bottom layer 16 and top layer 17 of the metal core 11 are to have a multi-layer structure constituted by three or more layers, simply repeat the above insulation-layer forming process and conductive-layer forming process (second and fourth through seventh steps).

(8) Eighth Step—FIG. 5(b)

Next, laser light is irradiated onto the surface, where an opening 17a is to be formed, of the first insulation layer 21 and second insulation layer 22 of the top layer 17, to remove the opening area and thereby form the opening 17a through which the island-like shape 38 of the metal core 11 becomes exposed.

(9) Ninth Step—FIG. 5(c)

Next, this opening 17a is masked and the remaining surface, including the bridges 39, 40 linked to the island-like shape 38 of the metal core 11, is etched to remove the island-like shape 38 and connect non-through parts, thereby forming, for example, the cavity area 15a for storing the tall electronic component 15. When this island-like shape 38 is removed, the bridges 39, 40 are also etched around the masked area. The bridges 39, 40 illustrated have their walls concave like curved surfaces beyond the masked area, but this concavity is a general phenomenon associated with etching. In the meantime, holes 39a, 40a are formed in the insulator 21a on the inner side face of the cavity area 15a. These holes 39a, 40a are formed at the same time when the walls of bridges 39, 40 are etched beyond the masked area during the etching of bridges 39, 40.

It is also possible not to use the etching method, in which case the opening 17a in the first insulation layer 21 and second insulation layer 22 of the top layer 17 is formed by means of laser cutting or drilling, while at the same time the metal core 11 is made free of any divisions to remove the island-like shape 38, in the eighth step above.

The cavity area 15a for storing an electronic component, as formed above, has a unique benefit in that it can prevent unwanted electrical connection (shorting) between the metal core 11 and any electronic component mounted in the cavity area 15a, such as the tall electronic component 15, because the inner wall of the opening 12 is covered with the insulator 21a (formed simultaneously with the first insulation layer 21).

(10) Tenth Step—FIG. 6(a)

Next, holes 47, 48 are opened in the first insulation layer 18 forming the bottom of the cavity area 15a, by means of laser cutting, counterboring, etc., to expose the wiring patterns 28c, 29c buried in the first insulation layer 18 and second insulation layer 19.

(11) Eleventh Step—FIG. 6(b)

Next, holes 49 to 52 are opened also in the second insulation layer 22 of the top layer 17, by means of laser cutting, counterboring, etc., to expose the wiring patterns 24b, 25b, 26b, 27b buried in the second insulation layer 22. This eleventh step and above tenth step may be swapped.

(12) Twelfth Step—FIG. 6(c)

Next, the holes 49 to 52 formed in the eleventh step are metal-plated on the inside or on inner walls or filled with conductive paste to make them conductive parts 24c, 25c, 26c, 27c, while at the same time a metal film made of copper, etc., is formed on these conductive parts 24c, 25c, 26c, 27c and this metal film is patterned to form wiring patterns 24d, 25d, 26d, 27d.

(13) Thirteenth Step—FIG. 7(a)

Next, solder resist is formed on the top layer 17 and gold plating 23 is applied on the surface layer electrodes.

(14) Fourteenth Step—FIG. 7(b)

Next, solder, conductive adhesive, anisotropic conductive adhesive or other conductive material is coated, by the dispenser method, etc., on the holes 47, 48 in the first insulation layer 18 forming the bottom of the cavity area 15a, to provide conductive parts 28b, 29b. These conductive parts 28b, 29b, together with the conductive parts 28a, 29a and wiring patterns 28c, 29c formed earlier, constitute the fifth electrode 28 and sixth electrode 29.

(15) Fifteenth Step—FIG. 7(c)

Next, an electronic component, such as the tall electronic component 15, is mounted in the cavity area 15a, followed by post-treatment appropriate for each material, such as heat treatment to melt solder. In this example, an inductor is used as the electronic component mounted in the cavity area 15a. Note that this is only one example of an electronic component taller than the depth of the cavity area 15a. Any component can be used as long as it is taller than the metal core.

Even when the component is shorter than the metal core, a reinforcement pattern 30 may still be formed to reinforce mechanical strength, if any force is applied to the electronic component in the step to store the electronic component.

By implementing the above steps (first through fifteenth steps), a printed wiring board 10 having the structure shown in FIG. 1 can be manufactured.

The next (sixteenth) step may be performed after the above fifteenth step.

(16) Sixteenth Step

Figure 9:
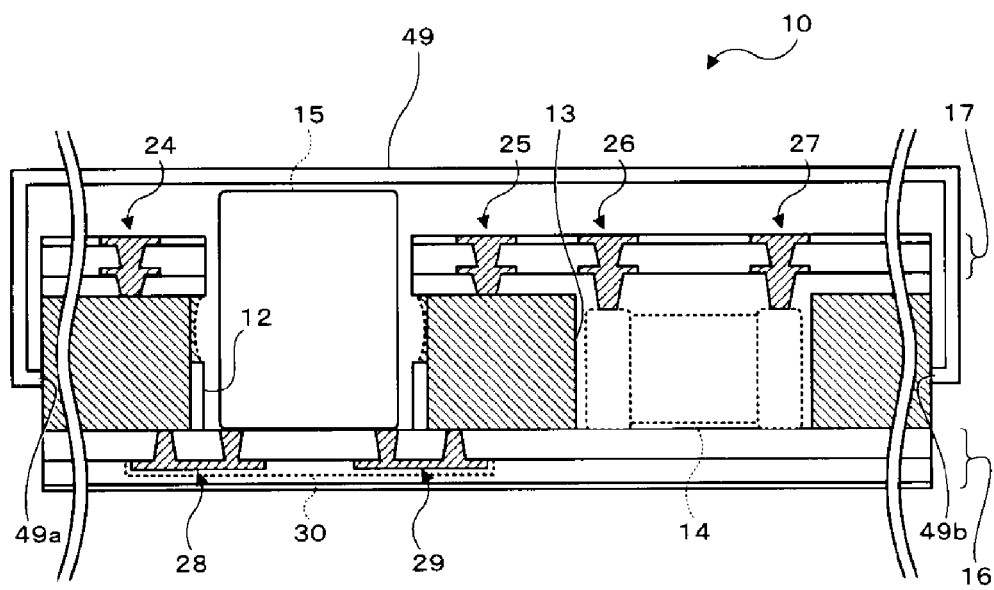
FIG. 9 illustrates a manufacturing process diagram for the printed wiring board in the first embodiment, showing the sixteenth step.

FIG. 9 is a manufacturing process diagram for the printed wiring board in the embodiment, showing the sixteenth step.

In this step, the printed wiring board 10 manufactured through the above first through fifteenth steps is covered with a shield case 49. This shield case 49 has been formed in the shape of a box with its bottom side open, using aluminum or other metal material, resin material (such as plastic) on which conductive film has been formed, or other material having an electromagnetic shielding effect. Its open end faces 49a, 49b are electrically connected to the side faces of the metal core 11. This way, inside and outside of the printed wiring board 10 can be electromagnetically shielded by the shield case 49, to protect against EMI (prevent irradiation of electromagnetic waves to the outside and entry of electromagnetic waves from the outside).

Figure 18:
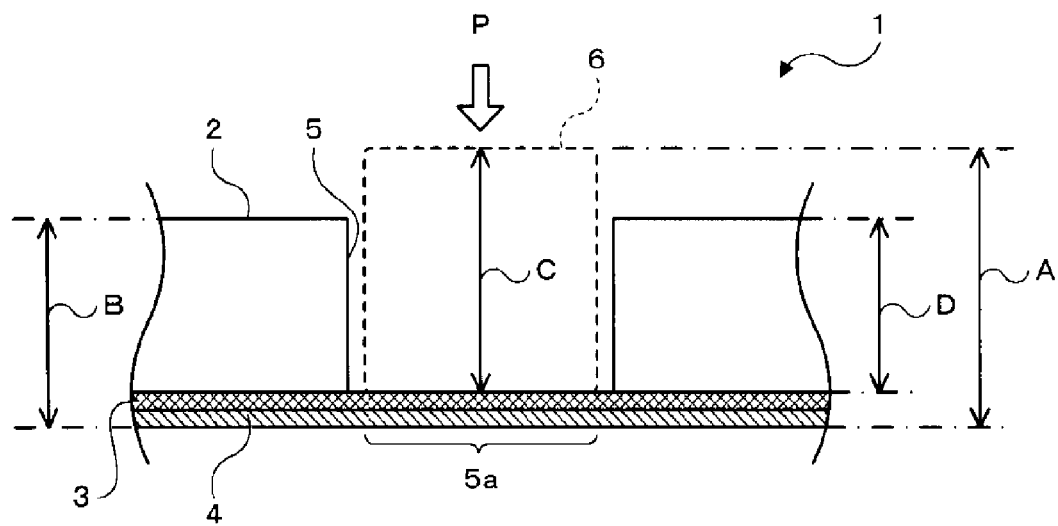
FIG. 18 is a schematic structural diagram of the background art.

According to the aforementioned structure and manufacturing process, this embodiment provides the following effects:

(a) Existence of the reinforcement pattern 30 at the bottom of the cavity area 15a for storing the relatively tall electronic component 15 prevents the bottom of the cavity area 15a from cracking or detaching even when, for example, the head of the tall electronic component 15 is pressured in any way (refer to P in FIG. 18). As a result, a printed wiring board 10 offering excellent mechanical strength and high reliability can be achieved.

(b) The reinforcement pattern 30 is formed by effectively utilizing the unused parts of wiring patterns 28c, 29c. To be specific, when wiring patterns 28c, 29c are formed from the metal film 101 in the sixth step (FIG. 4(c)), the reinforcement pattern 30 is formed simultaneously from the same metal film 101. This way, the wiring patterns 28c, 29c and reinforcement pattern 30 can be formed simultaneously in one step (sixth step), which eliminates the need for an additional step and prevents cost increase. This is also a resource-saving measure, because the parts that would otherwise be removed are effectively utilized to form the reinforcement pattern 30.

(c) Also, an insulator is formed on the inner wall of the cavity area 15a for storing the tall electronic component 15, which is formed simultaneously with the first insulation layer 21, and this provides a unique benefit of preventing unwanted electrical connection (shorting) between the metal core 11 and electronic component (tall electronic component 15) mounted in this cavity area 15a.

(d) In addition, this cavity area 15a for storing the tall electronic component 15 can also be formed for a very thin multi-layer printed wiring board (such as one with a thickness of approx. 1 mm), which contributes to development of thinner electronic devices. This is because the present invention includes a step to form an island-like shape 38 on the metal core 11, a step to form wiring layers on both sides of this metal core 11, a step to open one wiring layer, and a step to utilize this opening to remove the aforementioned island-like shape 38, thereby allowing the area left after removing the island-like shape 38 to be used as the cavity area 15a for storing the tall electronic component 15. The present invention also includes a step to fill with an insulator 21a the trench-shaped opening 38a formed around the island-like shape 38, which allows the side wall of the cavity area 15a to be covered with the insulator 21a, thereby avoiding shorting between the tall electronic component 15 and metal core 11.

Next, variations of the embodiment are explained.

Figure 10:
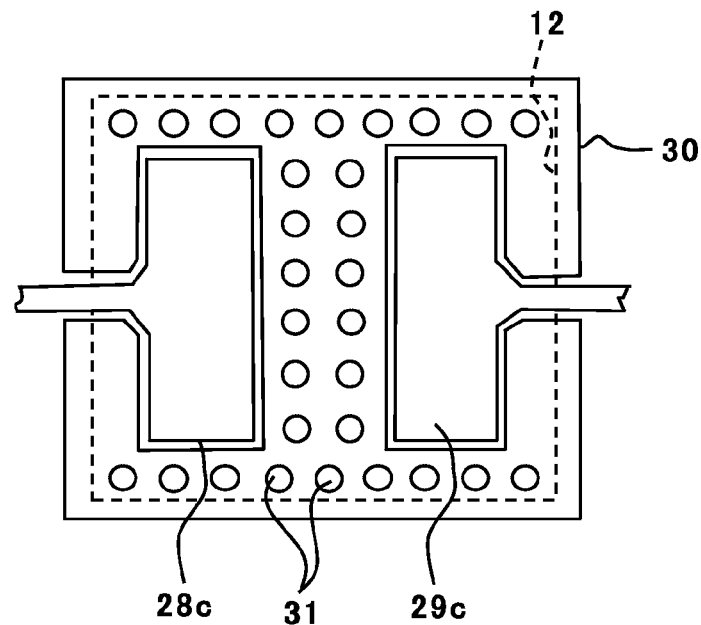
FIG. 10 is a drawing showing the first variation of the reinforcement pattern 30.

FIG. 10 shows a first variation of the reinforcement pattern 30. In this first variation, the reinforcement pattern 30 has many small holes 31 formed in an array at an equal pitch, or at irregular pitches or in a random manner. This way, the first insulation layer 18 and second insulation layer 19 come in contact with each other through the small holes 31, which increases the adhesion between the two insulation layers 18, 19. Note that the shape of small holes 31 is not limited to the one illustrated (circle). They can have any other shape, such as oval, rectangle or diamond. The area ratio of small holes 31 should preferably be 20 to 30% of the total area. If the formed holes occupy more area, the fundamental purpose of the reinforcement pattern 30 will be lost and mechanical strength will drop.

Figure 11:
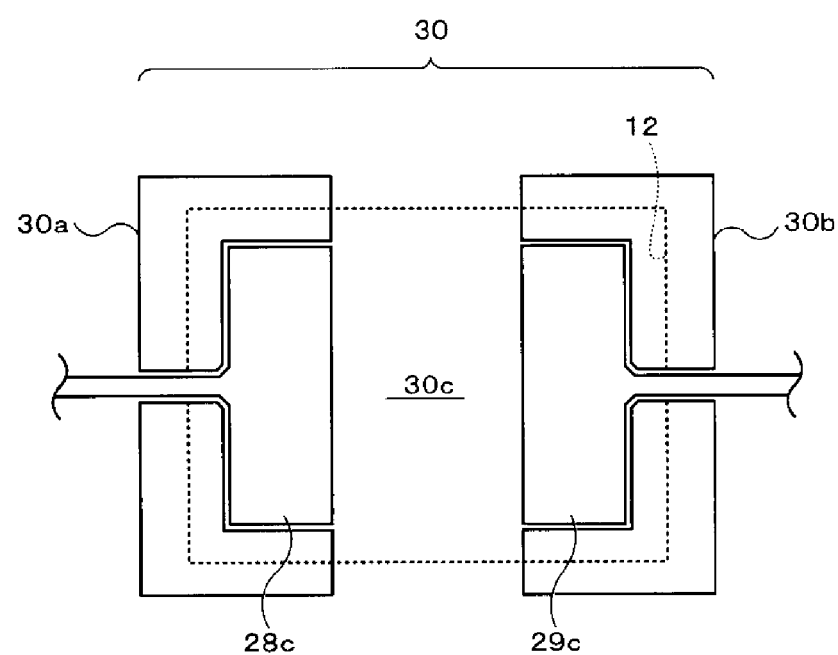
FIG. 11 is a drawing showing the second variation of the reinforcement pattern 30.

FIG. 11 shows a second variation of the reinforcement pattern 30. In this second variation, the reinforcement pattern 30 is comprised of a first reinforcement pattern 30a and a second reinforcement pattern 30b at the left and right in the figure. In other words, the reinforcement pattern 30 is divided into two and a space 30c is provided in between. In this case, cross wirings may be formed in this space 30c.

Figure 12:
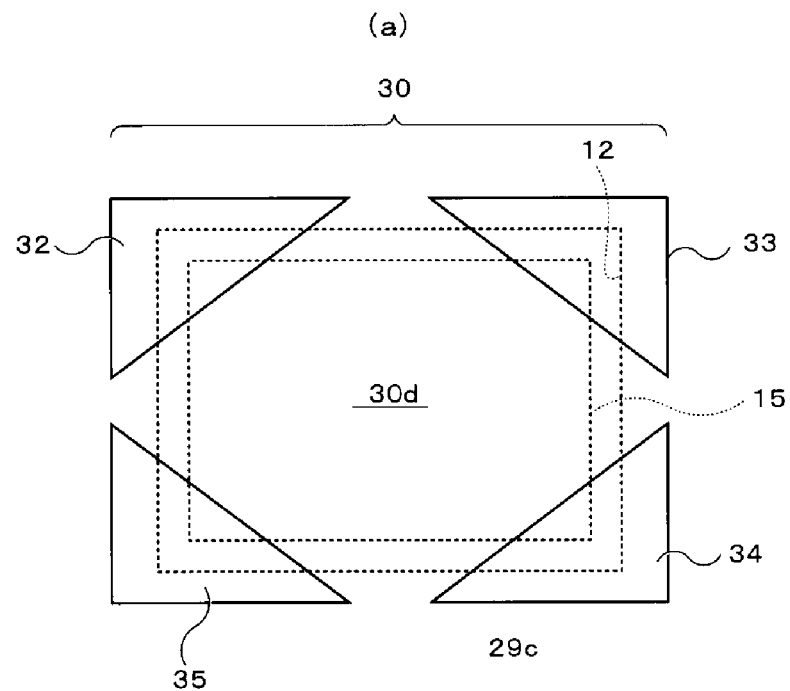
FIG. 12 is a drawing showing the third variation (a) and fourth variation (b) of the reinforcement pattern 30.
Figure 12:
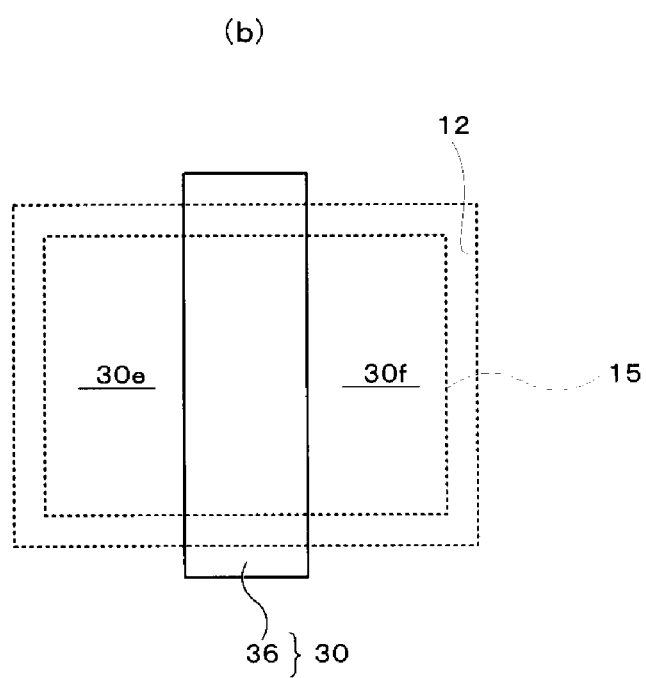

FIG. 12 shows a third variation (a) and fourth variation (b) of the reinforcement pattern 30. In the third variation (a), the reinforcement pattern 30 is divided into, and comprised of, four triangle reinforcement patterns (first reinforcement pattern 32 through fourth reinforcement pattern 35). The first reinforcement pattern 32 is positioned at the top left-hand corner of the opening 12, second reinforcement pattern 33 is positioned at the top right-hand corner of the opening 12, third reinforcement pattern 34 is positioned at the bottom right-hand corner of the opening 12, and fourth reinforcement pattern 35 is positioned at the bottom left-hand corner of the opening 12. As with the second variation, cross wirings can be formed.

In the fourth variation (b), the reinforcement pattern 30 is comprised of one reinforcement pattern of vertically long rectangular shape 36 covering the top side and bottom side of the opening 12.

Figure 13:
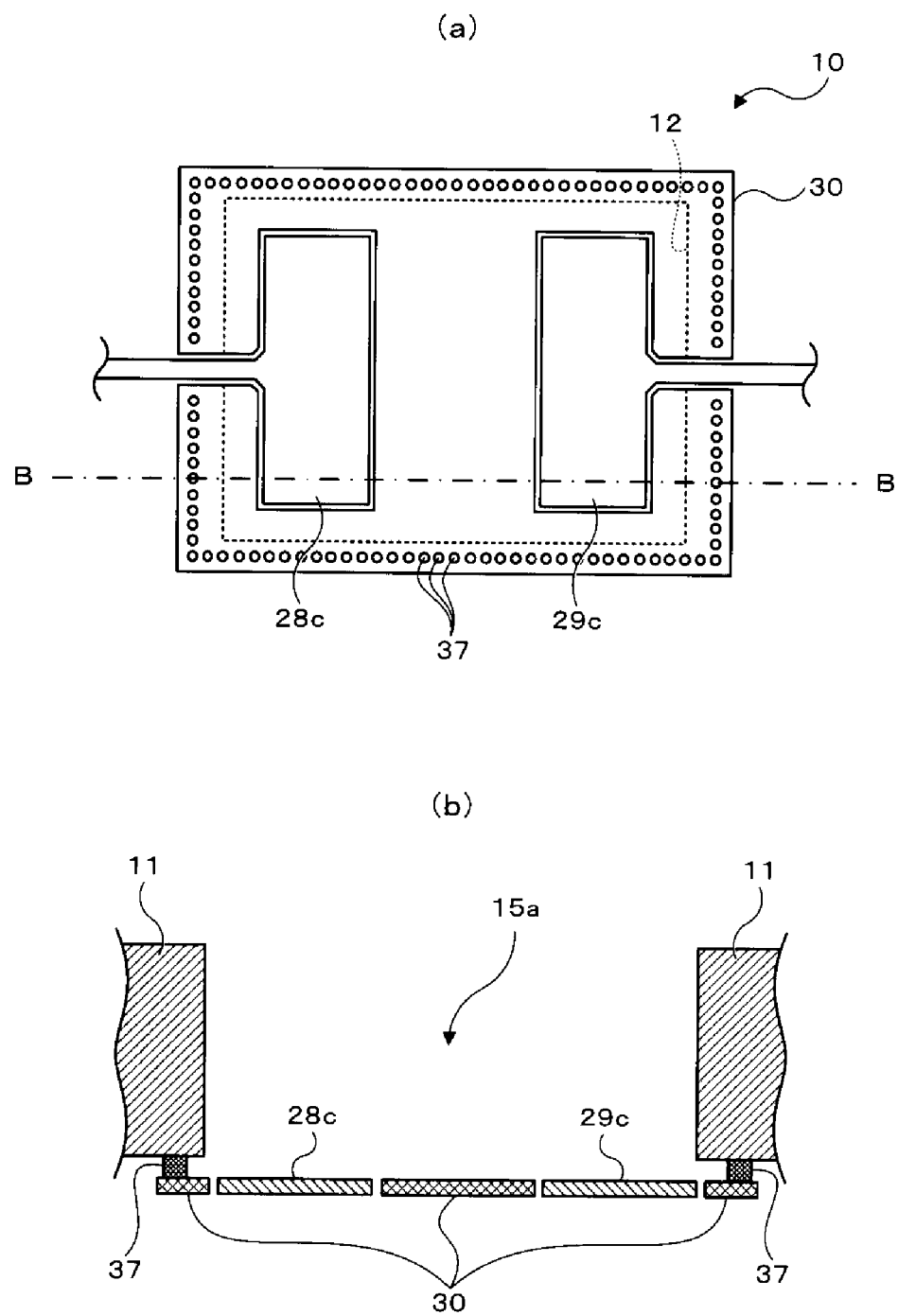
FIG. 13 is a drawing showing the fifth variation of the reinforcement pattern 30, where (a) is a plan view of the variation and (b) is a B-B section view of (a).

FIG. 13 shows a fifth variation of the reinforcement pattern 30, where (a) is a plan view of the variation and (b) is a B-B section view of (a). This reinforcement pattern 30 is such that many via conductors 37 are formed in an array along the four sides of the pattern, and this array part is where the reinforcement pattern overlaps the metal core (refer to the hatched area in FIG. 2(b)). These via conductors 37 have two functions. Their first function is to electrically connect the reinforcement pattern 30 and metal core 11 through the via conductors 37. In this fifth variation, therefore, the reinforcement pattern 30 and metal core 11 can have the same electrical potential and, because the metal core 11 is generally used at a ground potential, the reinforcement pattern 30 can also be given a ground potential to shield the bottom of the opening 12. Their second function is to firmly connect the reinforcement pattern 30 and metal core 11 through the via conductors 37. To be specific, the via conductors 37 can be made with metal material to connect the reinforcement pattern 30 and metal core 11 to create an integral structure constituted by three members, i.e., via conductors 37, reinforcement pattern 30 and metal core 11, thereby causing the metal core 11 to securely support the reinforcement pattern 30 and further strengthen the bottom of the cavity area 15a. If this second function is given greater focus, these via conductors 37 can be called "reinforcement vias." These via conductors 37 can be formed, after the aforementioned fifth step, together with other vias in the same layer. Needless to say, the size, quantity and layout of via conductors 37 can be adjusted freely according to the shape of the reinforcement pattern 30 and other design items.

If the reinforcement pattern 30 has a shielding effect, the following additional benefit is also achieved. Assume that the tall electronic component 15 stored in the cavity area 15a is an inductor. Leakage flux from this inductor tends to flow toward lower impedance, and therefore it flows into the reinforcement pattern 30 having a ground potential. Since generally leakage flux can lower the L value of the inductor, ideally it should be zero. However, the L value can be fine-tuned by utilizing the fact that leakage flux flows into the reinforcement pattern 30. By changing the shape of reinforcement pattern 30 in different ways, for example, as shown in FIGS. 10, 11 and 12, the amount of leakage flux flowing into the reinforcement pattern 30 changes according to each variation, and this has the effect of fine-tuning the L value.

Figure 14:
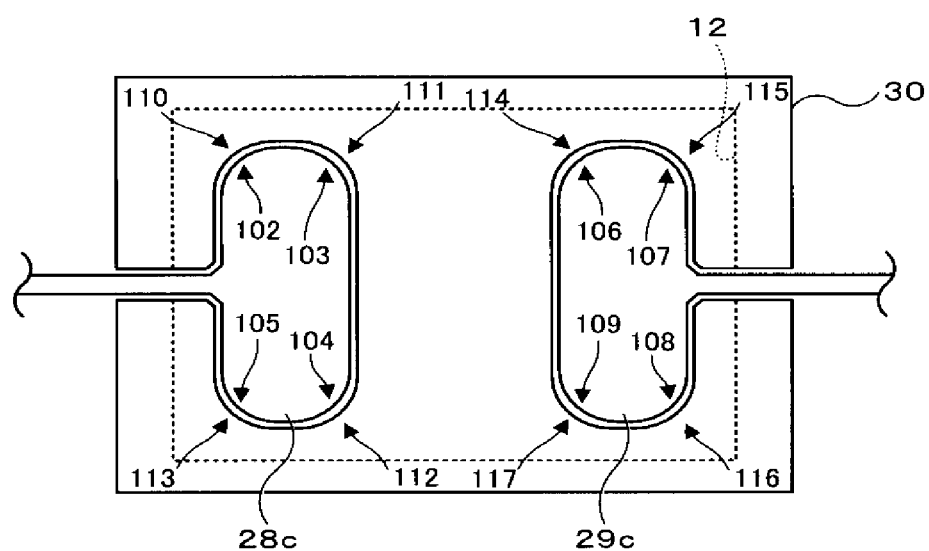
FIG. 14 is a drawing illustrating the sixth variation of the reinforcement pattern 30.

FIG. 14 shows a sixth variation of the reinforcement pattern 30. In this sixth variation, corners 102 to 109 of the wiring patters 28c, 29c are rounded, and corners 110 to 117 of the reinforcement pattern 30 corresponding to these corners 102 to 109 are also rounded. Here, "rounding" refers to changing sharp edges into a smooth line. By these "rounding" operations, high-frequency characteristics can be improved. This is because a high-frequency electric field tends to concentrate on sharp edges to cause high-frequency characteristics to change. Once sharp edges are gone, electric field concentration can be suppressed to stabilize high-frequency characteristics.

Note that in the above embodiment, the wiring pattern 30 is formed by utilizing the unused parts of the wiring patterns 28c, 29c to reinforce the bottom of the cavity part 15a, but it is also possible to form the first insulation layer 18, second insulation layer 19, or both, of the bottom layer 16 with resin containing glass cloth or nonwoven fabric, in addition to providing the above reinforcement pattern 30. Such resin containing glass cloth or nonwoven fabric also has a substantial reinforcement effect and, combined with the above reinforcement pattern 30, it can demonstrate a greater reinforcement effect.

Second Embodiment

Next, the second embodiment is explained. The difference from the above first embodiment lies in how the cavity area 15a for storing the tall electronic component 15 is created. In the above first embodiment, a part of the metal core 11 is left as an island-like shape 38, which is subsequently removed to form this cavity area 15a. This second embodiment is different in that the cavity area 15a is created without forming an island-like shape.

The manufacturing process of the second embodiment is explained. Note that in the following explanation, components also found in the aforementioned first embodiment are denoted by the same symbols. Accordingly, refer to the aforementioned first embodiment for symbols that are not explained.

Figure 15:
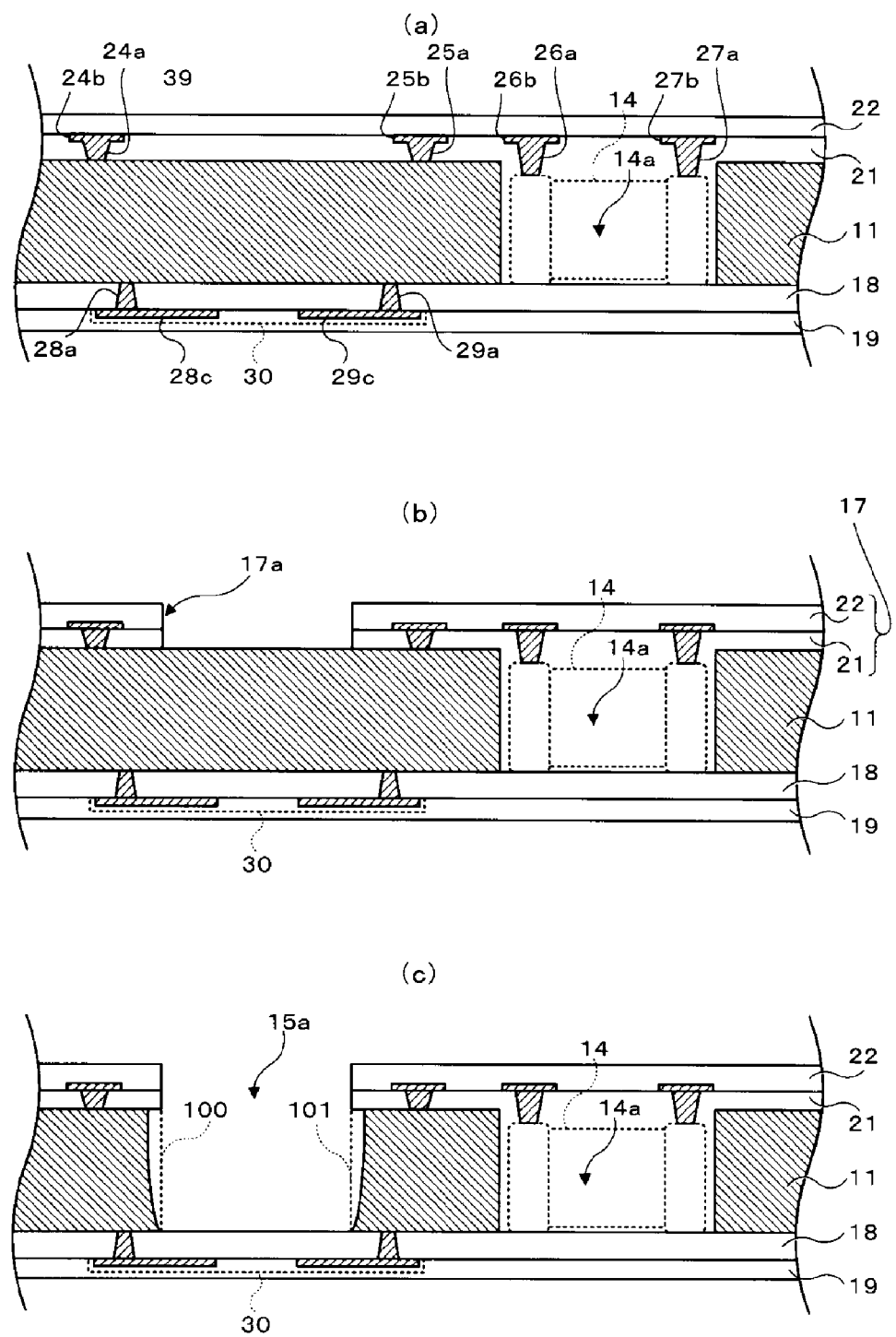
FIG. 15 illustrates a manufacturing process diagram for the printed wiring board in the second embodiment (first to third steps).

(1) First Step—FIG. 15(a)

Basically this step corresponds to the first step (FIG. 3(a)) through seventh step (FIG. 5(a)) in the first embodiment. The difference is that only one opening 13 is formed in the metal core 11. In other words, the opening 12 is not formed in the second embodiment. Accordingly, the island-like shape 38, bridges 39, 40 and opening 38a are not formed either.

(2) Second Step—FIG. 15(b)

Next, laser cutting, etc., is used to remove the location where an electronic component is to be stored, on the first insulation layer 21 and second insulation layer 22 of the top layer 17, to form an opening 17a through which the top surface of the metal core 11 is exposed.

(3) Third Step—FIG. 15(c)

Next, this opening 17a is masked and the metal core 11 is etched to form a cavity area 15a for storing a tall electronic component 15. At this time, the inner wall of the cavity area 15a is not a steep vertical wall like those indicated by broken lines 100, 101. This is because the rate at which etching progresses varies due to the thickness of the metal core 11. In reality, the inner wall draws a curve with its skirts at the bottom of the cavity area 15a. In other words, the area of opening of the cavity area 15a is the largest near the top close to the opening 17a and smallest at the bottom side.

Figure 16:
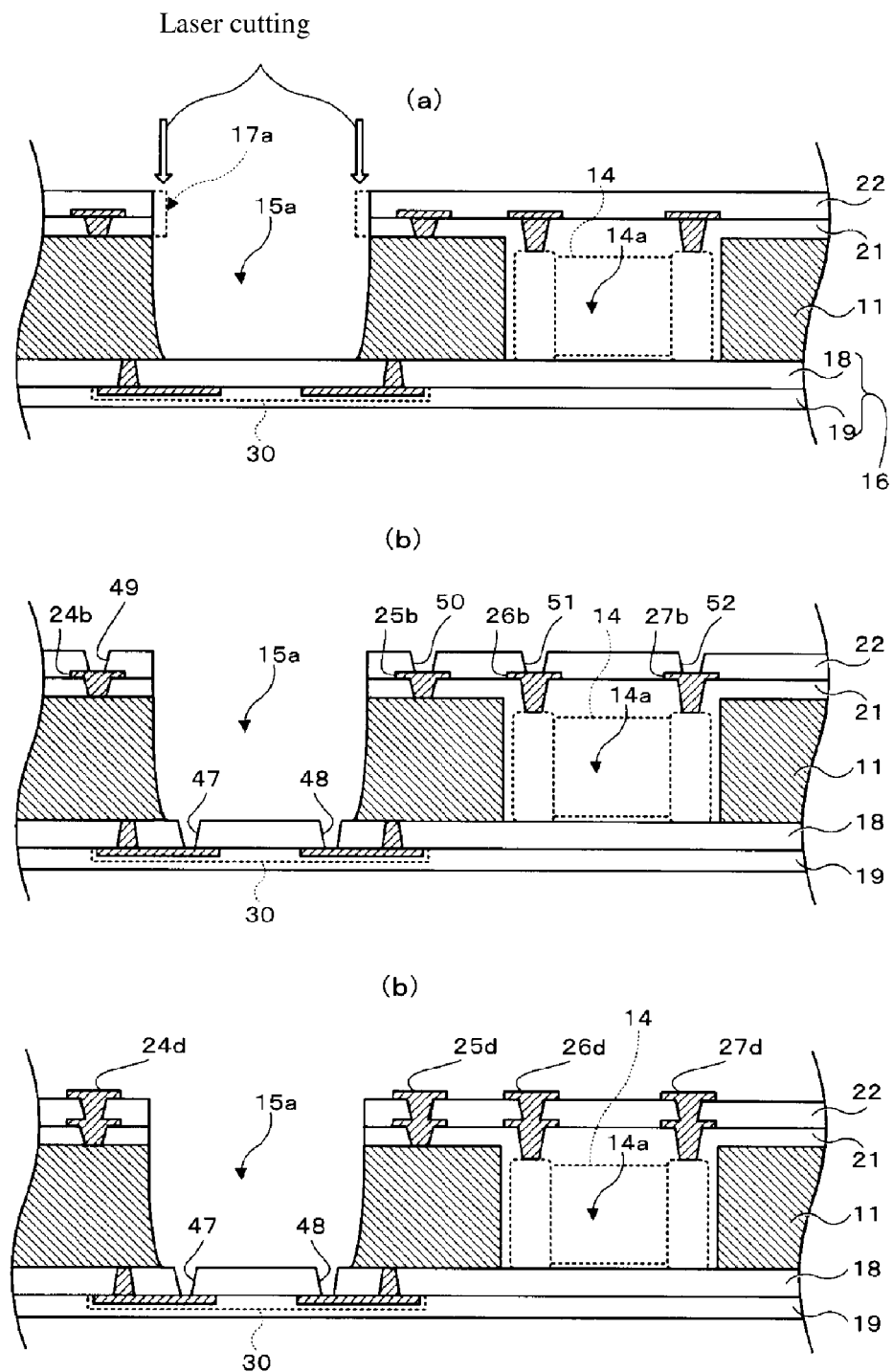
FIG. 16 illustrates a manufacturing process diagram for the printed wiring board in the second embodiment (fourth to sixth steps).

(4) Fourth Step—FIG. 16(a)

Next, unnecessary parts around the opening 17a are removed by laser cutting. If the laser beam reaches the surface of the bottom layer 16 (first insulation layer 18) at this time, the surface of this first insulation layer 18 may be damaged. In this second embodiment, however, the cross-section shape of the cavity area 15a expands at the bottom like skirts, as explained above, and therefore the laser beam can be received by these "skirts" to avoid damage to the surface of the first insulation layer 18.

(5) Fifth Step—FIG. 16(b)

Next, holes 47, 48 are opened by means of laser cutting, counterboring, etc., at the bottom of the cavity area 15a (i.e., first insulation layer 18) to expose the wiring patterns 28c, 29c buried in the first insulation layer 18, while at the same time holes 49 to 52 are opened by means of laser cutting, counterboring, etc., in the second insulation layer 22 of the top layer 17 to expose the wiring patterns 24b, 25b, 26b, 27b buried in the second insulation layer 22.

(6) Sixth Step—FIG. 16(c)

Next, the holes 49 to 52 formed in the fifth step are metal-plated on the inside (or on inner walls) or filled with conductive paste to form wiring patterns 24d, 25d, 26d, 27d.

Figure 17:
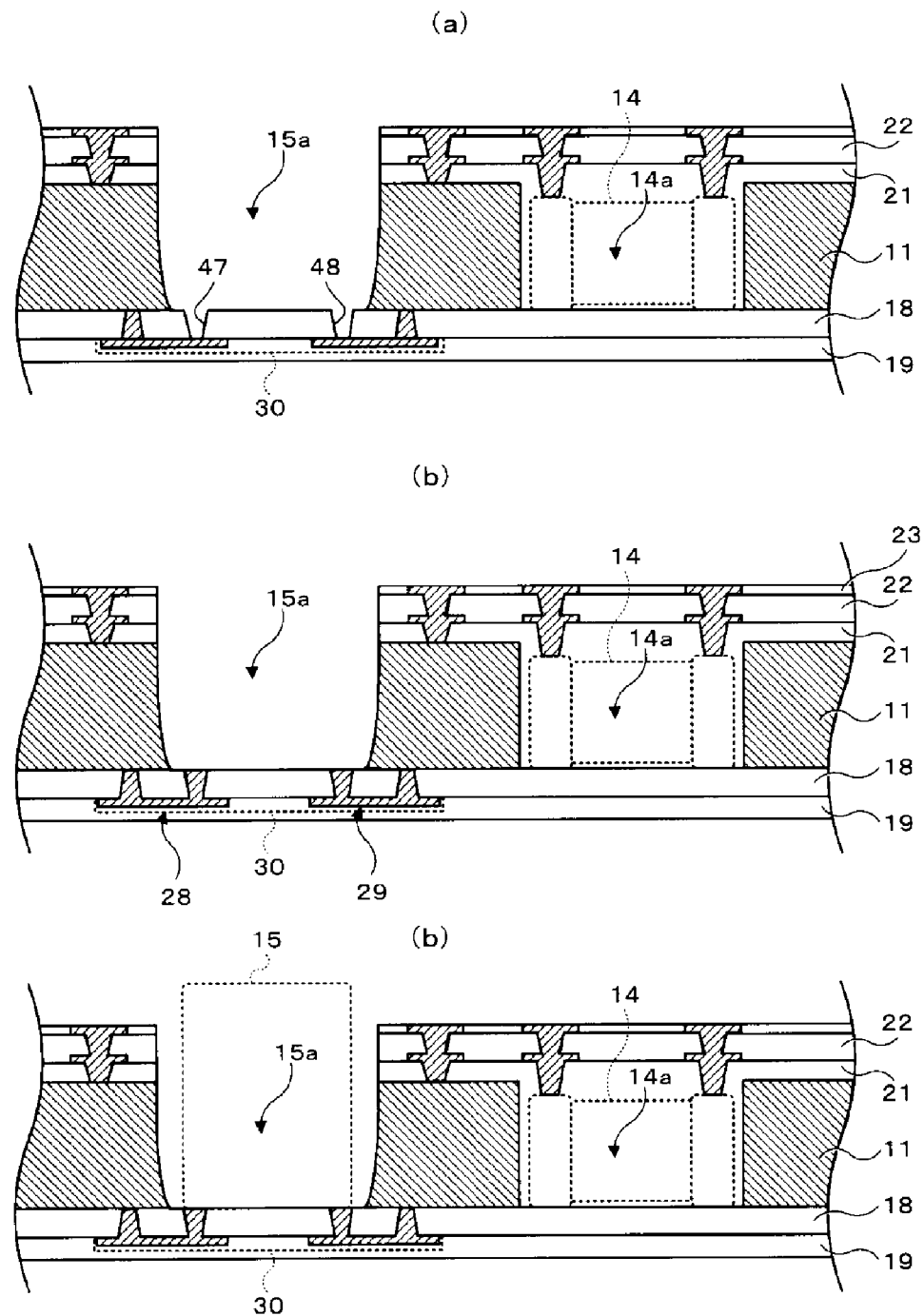
FIG. 17 illustrates a manufacturing process diagram for the printed wiring board in the second embodiment (seventh to ninth steps).

(7) Seventh Step—FIG. 17(a)

Next, solder resist is formed on the top layer 17 and gold plating 23 is applied on the surface layer electrodes.

(8) Eighth Step—FIG. 17(b)

Next, solder, conductive adhesive, anisotropic conductive adhesive or other conductive material is coated on the holes 47, 48 at the bottom of the cavity area 15a to constitute the fifth electrode 28 and sixth electrode 29.

(9) Ninth Step—FIG. 17(c)

Next, an electronic component (tall electronic component 15) is mounted in the cavity area 15a, followed by post-treatment appropriate for each material, such as heat treatment to melt solder. In this example, an inductor is used as the electronic component mounted in the cavity area 15a. Note that this is only one example of an electronic component taller than the depth of the cavity area 15a. Any component can be used as long as it is sufficiently tall.

By implementing the above steps (first through ninth steps), a printed wiring board having the cavity area 15a for storing the tall electronic component 15 can also be manufactured.

According to this second embodiment comprised of the above steps, there is no need to create the island-like shape 38 in the aforementioned first embodiment when forming the cavity area 15a for storing the tall electronic component 15. This also makes the bridges 39, 40 for linking this island-like shape 38 to the metal core 11 unnecessary, and consequently no bridge 39, 40 holes (refer to symbols 39a, 40a in FIG. 1) are left on the inner wall of the cavity area 15a after etching.

Also in this second embodiment, the bottom of the cavity area 15a becomes narrow when the cavity area 15a is formed by etching the metal core 11. This (narrower bottom) may be considered an etching problem, but in reality it is an advantage. In the fourth step where laser cutting is used to remove the projected areas at the top of the cavity area 15a, or unnecessary parts around the opening 17a, the laser beam may damage the surface of the first insulation layer 18 if it reaches the bottom of the cavity area 15a (i.e., first insulation layer 18). However, the cross-section shape of the cavity area 15a expands at the bottom like skirts, and therefore the laser beam can be received by these "skirts" to avoid damage to the surface of the first insulation layer 18.

DESCRIPTION OF THE SYMBOLS

10 Printed wiring board
11 Metal core
12 Opening
15 Tall electronic component
15a Cavity area
17a Opening
16 Bottom layer
17 Top layer
18, 21 First insulation layers
19, 22 Second insulation layers
28c, 29c Wiring patterns
30 Reinforcement pattern
38 Island-like shape
38a Opening
39, 40 Bridges

What is claimed is:

1. A printed wiring board with a cavity area capable of mounting an electronic component therein, where the cavity area is formed in a sheet-shaped metal core as a through-opening connecting two principle sides of the metal core in a location where an electronic component is to be stored, and an insulation layer is formed on and in contact with one principle side of the metal core and covers one end of the opening, forming a bottom of the cavity area;
    wherein on one side of the insulation layer which does not contact the metal core and which is opposite to the side of the insulation layer facing and contacting the metal core, wiring patterns for electrically connecting electrodes of the electronic component are provided, and a conductive reinforcement pattern constituting no part of any wiring patterns and not electronically contacting the wiring patterns is formed on said one side of the insulation layer in an area corresponding to the cavity area wherein the reinforcement pattern has an outer dimension wider than the opening, surrounds said wiring patterns, and extends inward beyond a periphery of the opening of the cavity area as viewed from the one side of the insulation layer, and
    wherein an insulator is formed over and extends along an inner side metal surface of the cavity area, constituting a part of an innermost non-contacting surface of the cavity area perpendicular to the bottom of the cavity area, said non-contacting surface of the cavity area being out of contact with the electronic component.

2. A printed wiring board according to claim 1, wherein the reinforcement pattern is made of the same material as the wiring patterns formed on the same side, and also formed simultaneously with these wiring patterns.

3. A printed wiring board according to claim 1, wherein the reinforcement pattern is formed wider than the area of the opening.

4. A printed wiring board according to claim 1, wherein the reinforcement pattern is a rectangle in a plan view.

5. A printed wiring board according to claim 4, wherein in addition to the insulation layer as a first insulation layer, a second insulation layer is formed on the first insulation layer, the wiring patterns, and the reinforcement pattern, and the reinforcement pattern has many small holes through which the first and second insulation layers are connected so as to increase adhesion of the first and second insulation layers.

6. A printed wiring board according to claim 1, wherein the reinforcement pattern is divided in a plan view.

7. A printed wiring board according to claim 1, wherein the reinforcement pattern is attached to the metal core via via-conductors formed through the insulation layer where the reinforcement pattern overlaps the metal core as viewed from the one side of the insulation layer.

8. A method for manufacturing a printed wiring board, comprising:
    a step to make a ring-shaped recess in a sheet-shaped metal core, and make the recess deeper so as to form a ring-shaped through-opening which is completely through the metal core except for a bridge part which is not a through-opening as viewed from above, said bridge part having a thickness less than a thickness of the core, thereby forming an island-like solid portion surrounded by the ring-shaped through-opening and connected to another portion of the core by the bridge part bridging the island-like solid portion and the other portion of the core, said island-like solid portion being separated from the other portion of the core except at the bridge part as viewed from above;
    a step to form, on one principle side of the metal core having the ring-shaped through opening with the bridge part, a wiring layer having an insulation layer and wiring patterns;
    a step to form, on the other principle side of the metal core opposite to said one principle side of the metal core, a wiring layer having an insulation layer, wiring patterns, and a reinforcement pattern;
    a step to open an area corresponding to the island-like solid portion in the wiring layer on said one principle side of the metal core having the ring-shaped through-opening with the bridge part; and then
    a step to remove the island-like solid portion by removing the bridge part together therewith through the opening in the wiring layer in the area corresponding to the island-like solid portion.

9. A method for manufacturing a printed wiring board according to claim 8, further comprising a step to fill with an insulator the opening around the island-like solid portion when the insulation layer is formed on the wiring layer on the one or the other principle side.

10. A method for manufacturing a printed wiring board according to claim 8, wherein the reinforcement pattern is made of the same material as the wiring patterns formed on the same side, and also formed simultaneously with these wiring patterns.

11. A method for manufacturing a printed wiring board according to claim 8, wherein the reinforcement pattern is formed wider than the area of the opening corresponding to the island-like solid portion.

12. A method for manufacturing a printed wiring board, comprising:
   a step to form, on one principle side of a sheet-shaped metal core, a wiring layer having an upper insulation layer and wiring patterns formed on the upper insulation layer;
   a step to form, on the other principle side of the metal core, a wiring layer having a lower insulation layer, wiring patterns formed on the lower insulation layer, and a reinforcement pattern;
   a step to open an area, where the opened area overlaps with the reinforcement pattern as viewed from above where an electronic component is to be stored, in the upper wiring layer formed on the one principle side so as to expose the metal core through the opened area; and then
   a step to form in the metal core an opening roughly as wide as the opened area in the upper wiring layer, by etching the exposed metal core utilizing the opened area of the upper wiring layer.

13. A method for manufacturing a printed wiring board according to claim 12, wherein the reinforcement pattern is made of the same material as the wiring patterns formed on the same side, and also formed simultaneously with these wiring patterns.

14. A method for manufacturing a printed wiring board according to claim 12, wherein the reinforcement pattern is formed wider than the area of the opening corresponding to the area where the electronic component is to be stored.

* * * * *